United States Patent
Maekawa

(10) Patent No.: US 11,314,241 B2
(45) Date of Patent: Apr. 26, 2022

(54) ABNORMALITY DIAGNOSIS APPARATUS AND ABNORMALITY DIAGNOSIS METHOD

(71) Applicant: Mitsubishi Electric Corporation, Chiyoda-ku (JP)

(72) Inventor: Kiyoshi Maekawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 452 days.

(21) Appl. No.: 16/301,111

(22) PCT Filed: Jun. 7, 2017

(86) PCT No.: PCT/JP2017/021170
§ 371 (c)(1),
(2) Date: Nov. 13, 2018

(87) PCT Pub. No.: WO2017/213183
PCT Pub. Date: Dec. 14, 2017

(65) Prior Publication Data
US 2019/0137984 A1    May 9, 2019

(30) Foreign Application Priority Data
Jun. 7, 2016    (JP) .............................. JP2016-113860

(51) Int. Cl.
*G05B 23/02*    (2006.01)
*G01M 13/02*    (2019.01)
(Continued)

(52) U.S. Cl.
CPC ......... *G05B 23/0235* (2013.01); *G01M 13/02* (2013.01); *G01M 13/028* (2013.01);
(Continued)

(58) Field of Classification Search
CPC .... G05B 23/0235; G05B 23/02; G05B 15/02; G06F 30/20; G01M 13/02; G01M 13/028; G06N 5/046
See application file for complete search history.

(56) References Cited

U.S. PATENT DOCUMENTS 5,540,051 A * 7/1996 Maruyama .............. F16D 31/02
60/438
2003/0091253 A1    5/2003 Morita et al.
(Continued)

FOREIGN PATENT DOCUMENTS

JP      2002-295464 A      10/2002
JP      2004103031 A   *   4/2004
(Continued)

OTHER PUBLICATIONS

International Search Report dated Aug. 29, 2017 in PCT/JP2017/021170 filed Jun. 7, 2017.

*Primary Examiner* — Tarun Sinha
*Assistant Examiner* — Lal C Mang
(74) *Attorney, Agent, or Firm* — Xsensus LLP

(57) ABSTRACT

An abnormality diagnosis apparatus includes: a model acceleration calculation unit to calculate model acceleration that is a predicted value of motor acceleration; a motor acceleration calculation unit to calculate the motor acceleration from one of position information and speed information on a motor; and an abnormality determination unit to diagnose whether a power transmission mechanism is abnormal on the basis of the result of comparison between the motor acceleration and the model acceleration.

13 Claims, 20 Drawing Sheets

(51) Int. Cl.
  *G06F 30/20*  (2020.01)
  *G01M 13/028*  (2019.01)
  *G05B 15/02*  (2006.01)
  *G06N 5/04*  (2006.01)

(52) U.S. Cl.
  CPC ............ *G05B 15/02* (2013.01); *G05B 23/02* (2013.01); *G06F 30/20* (2020.01); *G06N 5/046* (2013.01)

(56) References Cited

U.S. PATENT DOCUMENTS

| | | |
|---|---|---|
| 2004/0036621 A1 | 2/2004 | Morita et al. |
| 2006/0110086 A1 | 5/2006 | Morita et al. |
| 2007/0244599 A1* | 10/2007 | Tsai ................ B25J 9/1671 700/245 |
| 2008/0033695 A1* | 2/2008 | Sahara .............. G01H 1/003 702/185 |
| 2008/0215292 A1 | 9/2008 | Kato et al. |
| 2012/0022690 A1* | 1/2012 | Ooga ............... B25J 9/1633 700/258 |
| 2012/0065781 A1 | 3/2012 | Ikeda et al. |
| 2014/0196949 A1* | 7/2014 | Hareland ............ E21B 44/00 175/27 |

FOREIGN PATENT DOCUMENTS

| | | | |
|---|---|---|---|
| JP | 2008-32477 A | | 2/2008 |
| JP | 2010271185 A | * | 12/2010 |
| JP | 2012-61535 A | | 3/2012 |
| JP | 2013190289 A | * | 9/2013 |
| JP | 6144404 B1 | | 5/2017 |

* cited by examiner

ABNORMALITY DIAGNOSIS APPARATUS AND ABNORMALITY DIAGNOSIS METHOD

FIELD

The present invention relates to an abnormality diagnosis apparatus and an abnormality diagnosis method for a power transmission mechanism such as a reducer, a speed-up gear, and a ball screw used in a drive unit of a mechanical system such as a robot.

BACKGROUND

In related art, power transmission mechanisms for transmitting power of motors at respective joints are often used in articulated industrial robots. In an industrial robot that has been used for a long time, accumulation of a load acting during operation may cause a power transmission mechanism to deteriorate and lead to a fault. When a robot cannot provide its original performance or an industrial robot has suddenly stopped and work cannot be continued as a fault progresses, the production line needs to be stopped for repairs. There has thus been a demand for a technology for diagnosing whether power transmission mechanisms have deteriorated.

A method described in Patent Literature 1 discloses a technology for diagnosing whether a power transmission mechanism has deteriorated by comparing a vibration pattern caused by deterioration of the power transmission mechanism and a vibration pattern when the power transmission mechanism is driving normally. In addition, the method described in Patent Literature 1 diagnoses whether the power transmission mechanism has deteriorated from a spectrum extracted from disturbance torque acting on the power transmission mechanism.

CITATION LIST

Patent Literature

Patent Literature 1: Japanese Patent Application Laid-open No. 2008-32477

SUMMARY

Technical Problem

According to the technologies of the related art mentioned above, it is possible to diagnose whether a power transmission mechanism has deteriorated on the basis of the vibration patterns or the extracted spectrum. The technologies of the related art, however, are disadvantageous in that the influence of friction torque that changes depending on the temperature of a power transmission mechanism cannot be removed.

The present invention has been made in view of the above, and an object thereof is to provide an abnormality diagnosis apparatus that diagnoses whether a power transmission mechanism is abnormal with high accuracy by using motor acceleration, which is less likely to be affected by a change in friction.

Solution to Problem

In order to solve the above problem and achieve the object, an abnormality diagnosis apparatus according to an aspect of the present invention includes: a model acceleration calculation unit to calculate model acceleration that is a predicted value of motor acceleration; a motor acceleration calculation unit to calculate the motor acceleration from one of position information and speed information on the motor; and an abnormality determination unit to diagnose whether a power transmission mechanism is abnormal on a basis of a result of comparison between the motor acceleration and the model acceleration.

Advantageous Effects of Invention

The present invention produces an advantageous effect of diagnosing whether a power transmission mechanism is abnormal with high accuracy by using motor acceleration, which is less likely to be affected by a change in friction that is a change in characteristics.

DESCRIPTION OF EMBODIMENTS

Abnormality diagnosis apparatuses and abnormality diagnosis methods according to embodiments of the present invention will be described in detail below with reference to the drawings. Note that the present invention is not limited to the embodiments.

First Embodiment

Figure 1:
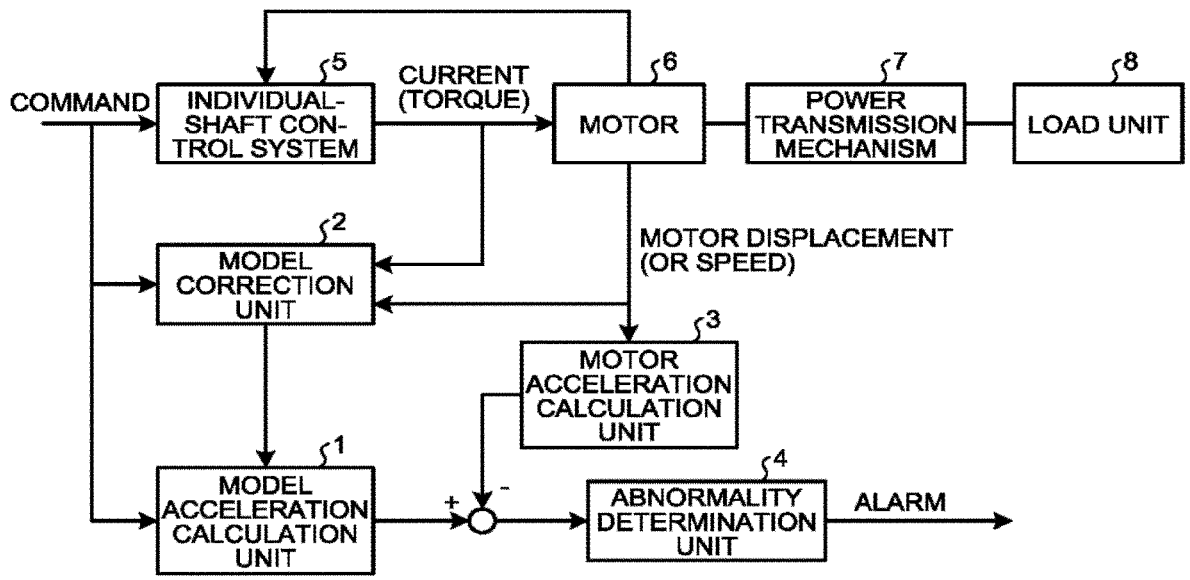
FIG. 1 is a block diagram of an abnormality diagnosis apparatus of a first embodiment.

FIG. 1 is a block diagram illustrating an abnormality diagnosis apparatus according to a first embodiment of the present invention. The abnormality diagnosis apparatus according to the present embodiment includes a model acceleration calculation unit 1, a motor acceleration calculation unit 3, and an abnormality determination unit 4. The model acceleration calculation unit 1 performs a predicted value calculation process to calculate a model acceleration of a motor 6 connected to a power transmission mechanism 7 included in machinery as a model acceleration. The motor acceleration calculation unit 3 calculates motor acceleration from position information or speed information on the motor 6. The abnormality determination unit 4 diagnoses whether the power transmission mechanism 7 for a drive shaft is abnormal on the basis of the result of comparison between the motor acceleration and the model acceleration. Note that the power transmission mechanism 7 according to the present embodiment functions as a reducer, an accelerator, or a gear motor.

The machinery is an industrial machine such as an industrial robot (not illustrated), a machine tool, a molding machine, or a conveyor, and a drive mechanism of the machinery has one or more drive shafts. The present embodiment is an embodiment applicable to any machinery; however, a case where an industrial robot having six drive shafts is to be controlled will be described below as an example. In the case of an industrial robot having six drive shafts, six driving motors 6 and six power transmission mechanisms 7 are provided.

In the case of the abnormality diagnosis apparatus having the example configuration illustrated in FIG. 1, a position command for the motor 6 that drives a corresponding shaft is generated in a control device included in the machinery. An individual-shaft control system 5 controls the motor 6 in accordance with the position command given from the machinery.

Figure 2:
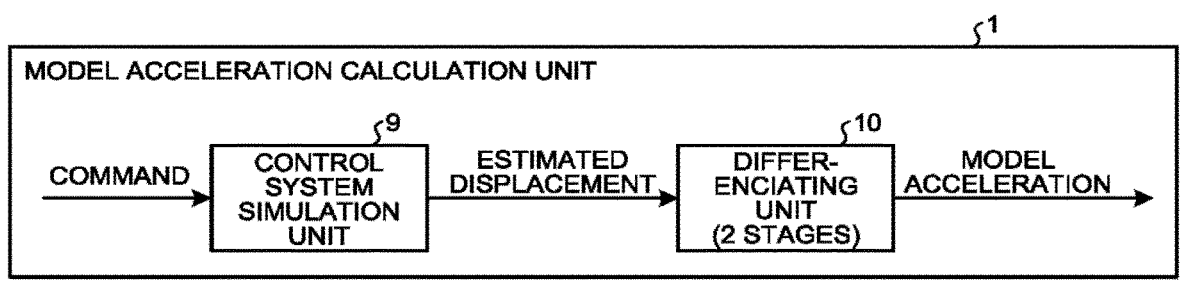
FIG. 2 is a block diagram illustrating the inside of a model acceleration calculation unit according to the first embodiment.

The model acceleration calculation unit 1 receives the position command and calculates a model acceleration that is the model acceleration of the motor 6 in accordance with the position command by performing the predicted value calculation process. FIG. 2 is a block diagram illustrating the inside of the model acceleration calculation unit 1 according to the first embodiment. In the model acceleration calculation unit 1, the position command is input to a control system simulation unit 9, and time differentiation is performed twice on an estimated displacement output from the control system simulation unit 9 in a predicted value calculation process performed by a differencing unit 10 to calculate the model acceleration.

Figure 3:
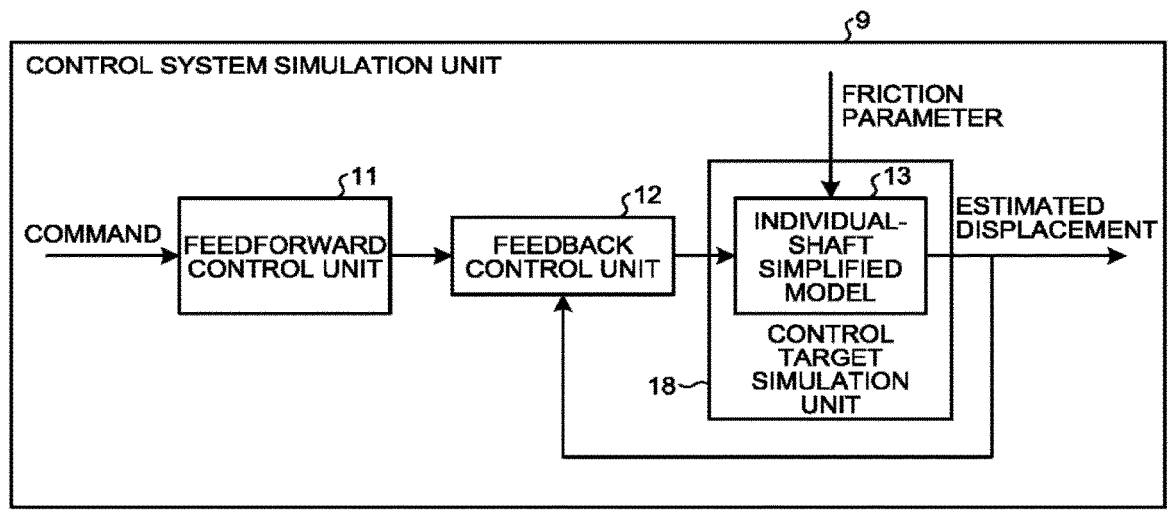
FIG. 3 is a block diagram illustrating the inside of a control system simulation unit according to the first embodiment.
Figure 4:
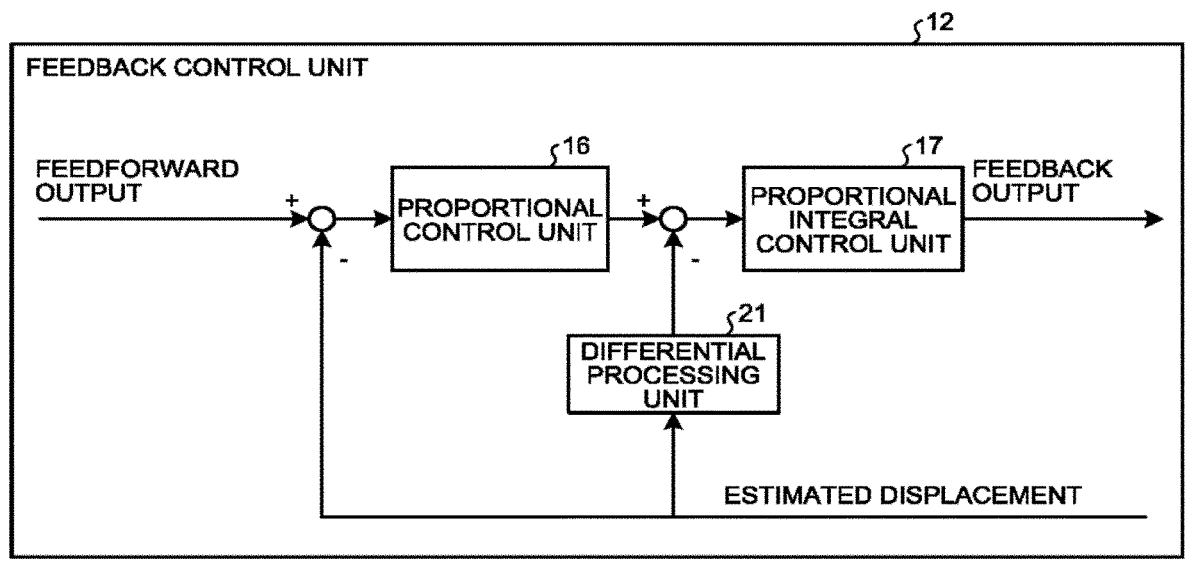
FIG. 4 is a block diagram illustrating the inside of a feedback control unit according to the first embodiment.

FIG. 3 is a block diagram illustrating the inside of the control system simulation unit 9 according to the first embodiment. The control system simulation unit 9 includes a feedforward control unit 11, a feedback control unit 12, and an individual-shaft simplified model 13. The feedforward control unit 11 is constituted by a single or multiple-stage filtering unit, performs feedforward control on the position command input from an external device, and outputs a controlled variable determined by the feedforward control. FIG. 4 is a block diagram illustrating the inside of the feedback control unit 12 according to the first embodiment. The feedback control unit 12 includes a proportional control unit 16, a proportional integral control unit 17, and a differential processing unit 21 of a control system used for feedback control of the machinery. The proportional control unit 16 performs position proportional control and speed proportional-integral control on an input controlled variable that is an output of the feedforward control.

The individual-shaft simplified model 13 is an approximate model of a control target viewed from each shaft in one-inertial system of inertia and friction. The estimated displacement output from the individual-shaft simplified model 13 in the control system simulation unit 9 is an estimated value of motor displacement that takes into account the characteristics of the feedforward control and feedback control. Note that, in the present embodiment, the control system simulation unit 9 in the model acceleration calculation unit 1 computes each of the estimated acceleration and the estimated speed. Specifically, the control system simulation unit 9 can calculate the estimated displacement by first computing the estimated acceleration, time-integrating the computed estimated acceleration to compute the estimated speed, and further time-integrating the estimated speed.

Alternatively, the control system simulation unit 9 in the model acceleration calculation unit 1 may output the estimated speed, perform time differentiation on the output estimated speed once, and then output the calculated value as the model acceleration. The control system simulation unit 9 controls each of the six shafts for a six-shaft industrial robot. Note that, while a model that also includes the characteristics of the control target is employed as the control system simulation unit 9 in the present embodiment, the feedforward control unit 11 can also be used as a simple model of the control system simulation unit 9.

A friction model included in the individual-shaft simplified model 13 calculates friction torque by using a friction parameter calculated by a model correction unit 2. Assume that the frictional force fi of the i-th shaft of the robot can be modeled by the following equation (1).

$$fi = k1i * \text{sgn}(vi) + k2i * vi \quad (1)$$

In equation (1), vi represents the speed of the i-th shaft, and sgn( ) is a function that outputs 1 when the result is positive, −1 when the result is negative, and 0 when the result is 0. In the present embodiment, the frictional force of each shaft is expressed by a sum of Coulomb friction dependent on the moving direction and viscous friction proportional to the speed. Note that the viscous friction is not necessarily proportional to the speed raised to the power of 1, but may be assumed to be proportional to the speed raised to the power of a value other than 1, e.g., proportional to the speed raised to the power of 0.5. Herein, a description will be given of a case, as an example, in which the viscous friction is assumed to be proportional to the speed raised to the power of 1. The model acceleration calculation unit 1 calculates parameters k1i and k2i in equation (1) by performing a sequential identification process.

In the present embodiment, the model acceleration calculation unit 1 uses motor torque τm calculated by multiplying the measured motor current value by a torque constant or motor torque τm detected by a torque sensor. Note that motor displacement pm is measured by a motor displacement measurement unit such as an encoder. The model correction unit 2 calculates time differential vm of the measured motor displacement pm and time differential am of the time differential vm. Subsequently, driving torque τ1 other than the frictional force is calculated from the motor displacement pm, the time differential vm, and the time differential am by equation (2) below. Note that, in the abnormality diagnosis apparatus according to the present embodiment, the individual-shaft control system 5 includes a motor current measurement unit. The motor current measurement unit can calculate the motor torque τm by multiplying the measured motor current by the torque constant.

$$\tau l = M(pm)am + h(pm, vm) + g(pm) \quad (2)$$

The values of yi, Ri, and ri are calculated by the following equations (3) to (5), and kpi[k] is calculated by the following equation (6):

$$yi[k] = [\text{sgn}(vmi[k]), vmi[k]] \quad (3)$$

$$Ri[k] = Ri[k-1] + st*(-si*Ri[k-1] + yi[k]^T yi[k]) \quad (4)$$

$$ri[k] = ri[k-1] + st*(-si*ri[k-1] + (\tau mi[k] - \tau li[k])*yi[k]^T) \quad (5)$$

$$kpi[k] = kpi[k-1] - st*Gi(Ri[k]kpi[k-1] - ri[k]) \quad (6)$$

where i-th shaft components of the driving torque τl, the motor torque τm, and the time differential vm are represented by τli, τmi, and vmi, respectively, and the value of a k-th identification period is expressed by [k].

In this process, a first element of kpi[k] is an identified value k1i[k] of k1i in the k-th identification period and a second element of kpi[k] is k2i[k] that is an identified value of k2i in the k-th identification period. Specifically, kpi calculated by equation (6) is obtained as a vector with two rows and one column. An element in the first row and the first column of kpi is the first element. An element in the second row and the first column of kpi is the second element. Note that st represents a period of sequential identification, and si and Gi represent preset gains. The model correction unit 2 outputs friction parameter identified values k1i[k] and k2i[k], which are identification results for each shaft, as friction parameter identification results to a control target simulation unit 18 in the model acceleration calculation unit 1. The control target simulation unit 18 is a model of the control target viewed from each shaft. Note that an identified gain is a constant and a matrix constituted by constants. The frictional force is calculated on the basis of equation (1) in the control target simulation unit 18. In the first embodiment, the control target simulation unit 18 may function as the individual-shaft simplified model 13. Note that the control target simulation unit 18 may modify an estimated friction associated with each shaft direction of the industrial robot in accordance with the friction parameter identified value calculated by the model correction unit 2.

Motor displacement indicating position information on the motor 6 measured by a displacement measurement unit, such as an encoder, or speed information indicating the speed of the motor 6 is input to the motor acceleration calculation unit 3. The motor acceleration calculation unit 3 performs time differentiation twice on the input motor displacement or performs time differentiation once on the speed information to calculate the motor acceleration. Note that motor displacement indicates a motor angle. The motor acceleration calculation unit 3 subtracts the motor acceleration calculated by the motor acceleration calculation unit 3 from the model acceleration calculated by the model acceleration calculation unit 1. The subtraction result is input to the abnormality determination unit 4. While subtraction is performed after the model acceleration and the motor acceleration are calculated in the present embodiment, the model correction unit 2 may subtract the motor displacement from the estimated displacement inside the model acceleration calculation unit 1 and perform time differentiation twice on the estimated displacement. Alternatively, the model correction unit 2 may perform time differentiation once on the estimated displacement inside the model acceleration calculation unit 1 to output the model speed, subtract the motor speed from the output model speed, and then perform time differentiation once on the calculated speed. Alternatively, the performing of time differentiation twice may be replaced by a process using a high-pass filter having corresponding characteristics. The high-pass filter has a characteristic of passing only signal components of frequencies higher than a preset frequency. Note that the abnormality determination unit 4 can diagnose whether the power transmission mechanism 7 is abnormal on the basis of the signal components having passed through the high-pass filter.

Figure 5:
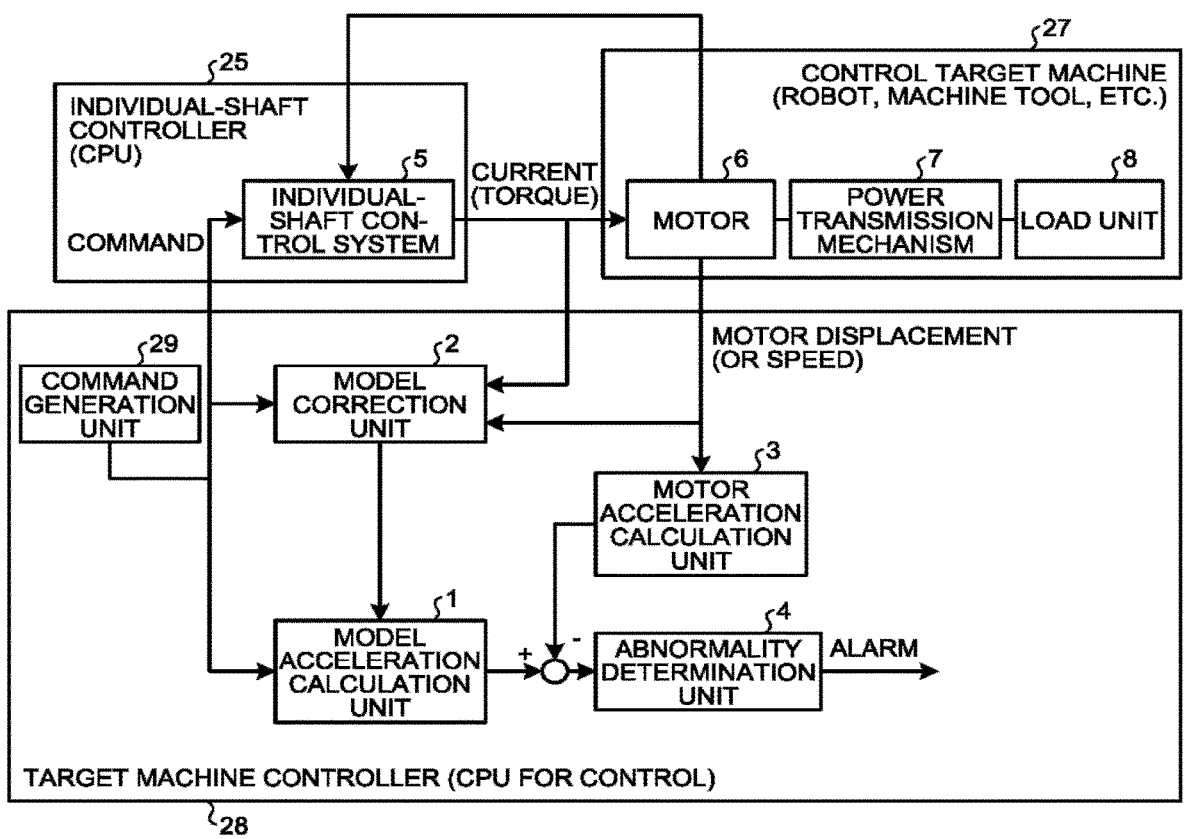
FIG. 5 is a diagram illustrating example implementation of a CPU for control in an abnormality diagnosis apparatus according to the first embodiment.

The abnormality determination unit 4 diagnoses whether the power transmission mechanism 7 for the drive shaft is abnormal on the basis of the result of comparison between the motor acceleration and the model acceleration. Specifically, the abnormality determination unit 4 calculates the maximum value of absolute values of the result of subtraction of the motor acceleration from the model acceleration. When the calculated maximum value of the absolute values is equal to or larger than a reference value, the power transmission mechanism 7 is diagnosed as abnormal. FIG. 5 illustrates example implementation of a CPU for control in an abnormality diagnosis apparatus 101 according to the first embodiment. In the example illustrated in FIG. 5, in the abnormality diagnosis apparatus 101, a target machine controller 28 is implemented by a central processing unit (CPU) for control. The CPU for control performs the respective functions of the model acceleration calculation unit 1, the model correction unit 2, the motor acceleration calculation unit 3, a command generation unit 29, and the abnormality determination unit 4 on an individual-shaft controller 25 or a control target machine 27 as a control target. Note that the CPU for control may be mounted on an external personal computer (PC) (not illustrated) to control the individual-shaft controller 25 or the control target machine 27.

Figure 6:
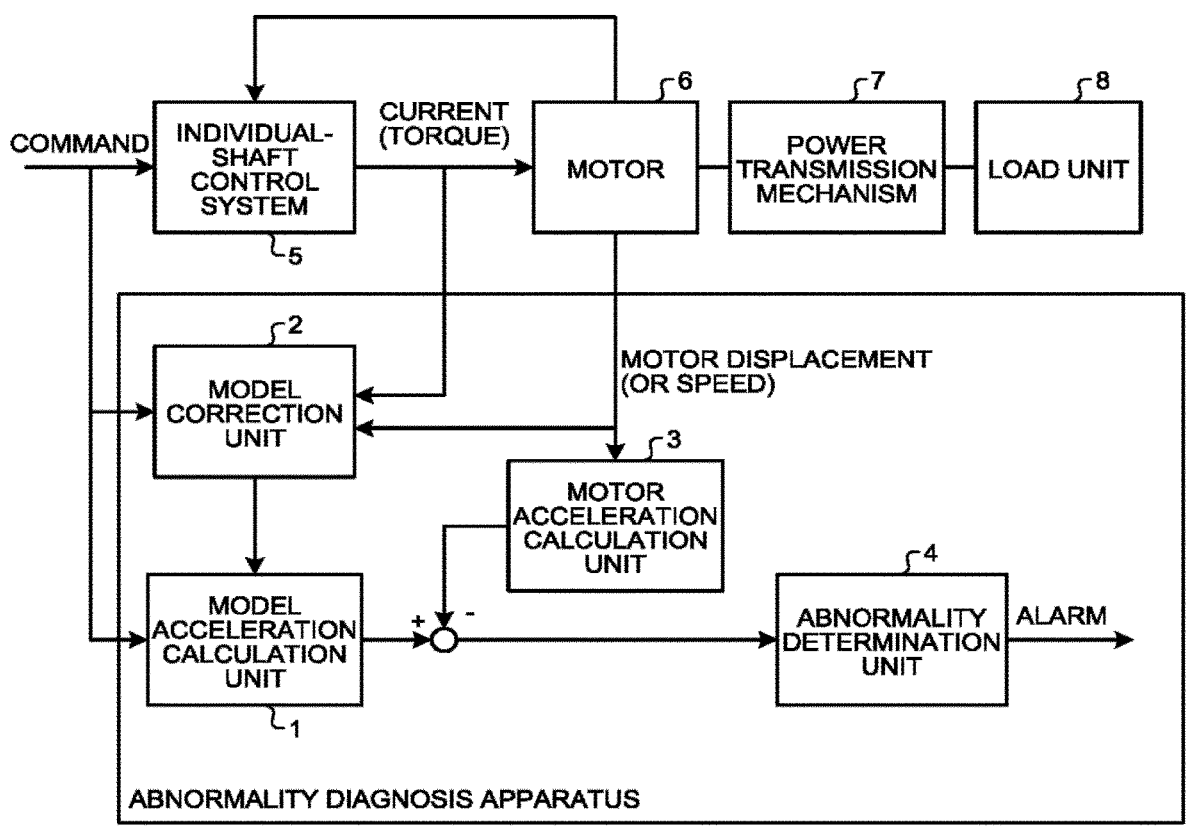
FIG. 6 is a configuration diagram in a case where the definition of the range of the abnormality diagnosis apparatus is changed in the first embodiment.
Figure 7:
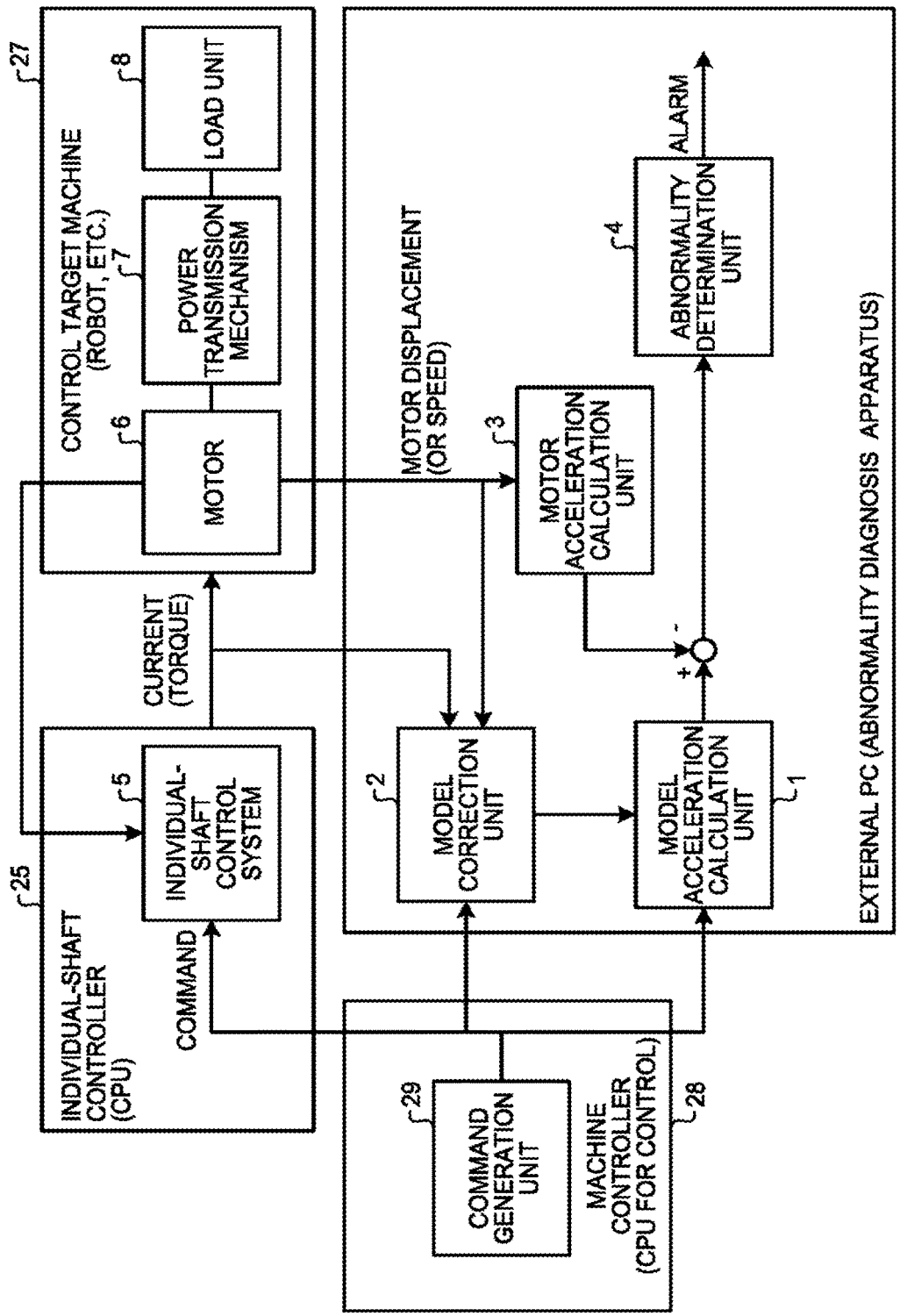
FIG. 7 is a configuration diagram in a case where the definition of the range of the abnormality diagnosis apparatus is changed in the first embodiment.

FIGS. 6 and 7 are configuration diagrams in cases where the definition of the range of the abnormality diagnosis apparatus is changed in the first embodiment. While the abnormality diagnosis apparatus illustrated in FIG. 5 includes the control target machine 27 that includes the motor, the power transmission mechanism, a load unit 8, and the like because the information on the motor 6 is used for diagnosing an abnormality, the abnormality diagnosis apparatus may be configured such that it includes the model acceleration calculation unit 1, the model correction unit 2, the motor acceleration calculation unit 3, and the abnormality determination unit 4 but does not include the individual-shaft control system and the control target machine 27 as illustrated in FIG. 6. Alternatively, the abnormality diagnosis apparatus may be implemented by an external computer as illustrated in FIG. 7.

It is known that, as a reducer deteriorates, vibration caused by the reducer may become gradually greater. In diagnosing an abnormality on the basis of the vibration level of a reducer, the accuracy of diagnosis is expected to be improved by use of data of operations with a small torque component other than the vibration. In addition, because the vibration caused by a reducer is correlated to the rotating speed, use of data in a section in which the rotating speed is constant in determination facilitates analysis.

In a case where a reducer is deteriorated, the characteristics may be not only such that the vibration caused by the reducer is increased but also that other changes in characteristics can be seen. For example, when a wave gear reducer is deteriorated and becomes increasingly worn, the rigidity of the reducer is lowered. In a ball screw mechanism to which a preload is applied, the preload is released and the rigidity of the ball screw mechanism is lowered as the ball screw mechanism becomes increasingly worn. As the rigidity of the reducer is lowered in this manner, vibration may be excited during acceleration or deceleration or vibration may be excited immediately after a halt. Thus, in order to determine lowering of rigidity from current or torque, the determination needs to be performed on the basis of current in a section in which acceleration or deceleration is performed or current immediately after a halt. Use of a high-pass filter for differences or the like is effective in extraction of vibration due to lowering of rigidity from a current waveform; it is, however, necessary to remove the influence of acceleration/deceleration torque and friction torque that are naturally included owing to acceleration/deceleration. The influence of the acceleration/deceleration torque can be removed by calculation when parameters such as the mass and the center of gravity of machinery such as a robot that is the control target are known. The friction torque, however, cannot be removed in advance because the friction torque varies depending on the temperature of the joint even in the same machines, which leads to a problem in that a change in the rigidity of a machine cannot be determined with high accuracy.

The abnormality diagnosis apparatus according to the present embodiment can diagnose whether the power transmission mechanism 7 is abnormal with high accuracy by lowering the influence of a change in friction that is a change in the characteristics.

Second Embodiment

A second embodiment differs from the first embodiment in the inside of the model correction unit 2 and in the inside of the abnormality determination unit 4. In the first embodiment, the model correction unit 2 performs sequential identification of the friction parameter to calculate the friction parameter. In the present embodiment, a section of a period during which abnormality determination is to be performed or a period indicating the time period during which abnormality determination is to be performed is set in advance, and the model correction unit 2 performs a process of identifying a friction parameter by using the method of least squares from driving torque, motor displacement, motor speed, and motor acceleration in the section or the period during which abnormality determination is performed. In the present embodiment, the model acceleration calculation unit 1 uses motor torque τm calculated by multiplying the measured motor current value by a torque constant or motor torque τm detected by a torque sensor. Note that motor displacement measured by a motor displacement measurement unit such as an encoder is represented by pm. The model correction unit 2 calculates a difference τdi between the driving torque τl and the motor torque τm of an i-th shaft by using equation (7) below. Note that the driving torque τl is calculated by substituting the time differential vm of the motor displacement pm and the time differential am of the time differential vm into equation (2).

$$\tau di = \tau mi - \tau li \qquad (7)$$

In this case, in identification of the frictional force by using data from the first period to the n-th period of the identification period, when a vector of n rows in which the element in the m-th row is τdi[m] is represented by Yti, a matrix with n rows and two columns in which the element in the m-th row and the first column is sgn(vmi[m]) and the element in the m-th row and the second column is vmi[m] is represented by Ai, and a pseudo inverse matrix of Ai is represented by $Ai^+$, the first element of P calculated by equation (8) below is an estimated value of Coulomb friction coefficient k1i and the second element of P is an estimated value of viscous friction coefficient k2i. Note that n represents the number of samples of data in each period. m represents each row of Yti and Ai. n and m are natural numbers satisfying 1≤m≤n.

$$P = Ai^+ Yti \qquad (8)$$

The identified or estimated friction parameter is a fixed value in each section of abnormality determination. The control target simulation unit 18 in the model acceleration calculation unit 1 computes the friction torque by using the identified or estimated friction parameter. The abnormality determination unit 4 calculates the maximum value of absolute values of the result of subtraction of motor acceleration from the model acceleration in a section during which abnormality determination is performed. When the calculated maximum value of the absolute values is equal to or larger than a reference value, the abnormality determination unit 4 diagnoses the power transmission mechanism 7 as abnormal.

The abnormality diagnosis apparatus according to the present embodiment can diagnose whether the power transmission mechanism 7 is abnormal with high accuracy by lowering the influence of a change in friction that is a change in the characteristics.

Third Embodiment

Figure 8:
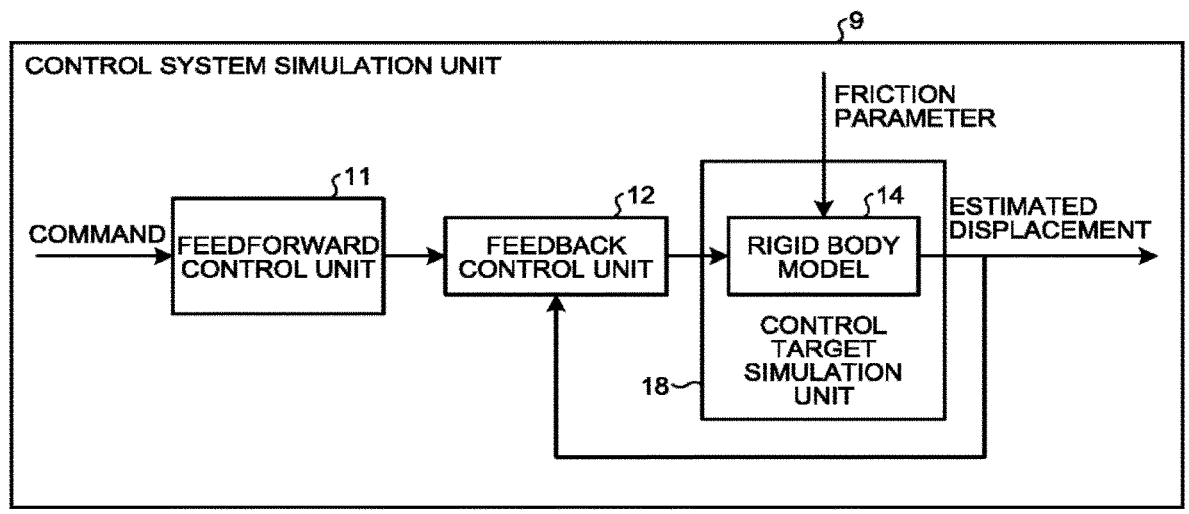
FIG. 8 is a block diagram illustrating the inside of a control system simulation unit according to a third embodiment.

A third embodiment differs from the first embodiment in the inside of the control system simulation unit 9. Thus, a description will be made only of the inside of the control system simulation unit 9. FIG. 8 is a block diagram illustrating the inside of the control system simulation unit 9 according to the third embodiment. In the first embodiment, the individual-shaft simplified model 13 is used as the control target simulation unit 18 in the control system simulation unit 9. FIG. 8 illustrates the control system simulation unit 9 according to the third embodiment. A rigid body model 14 illustrated in FIG. 8 calculates acceleration a by equation (9) below, calculates speed v by time-integrating the acceleration a, and calculates displacement p by time-integrating the speed v. In equation (9), τ represents an output of the feedback control unit 12, and a, v, and p represent the acceleration, the speed, and the displacement, respectively, calculated by the rigid body model 14.

$$a = M(p)^{-1}(\tau - h(p,v) - g(p) - f(v)) \tag{9}$$

$M(p)^{-1}$ represents an inverse matrix of $M(p)$. $M(p)$ represents an inertia matrix. $h(p,v)$ represents centrifugal force and Coriolis force, $g(p)$ represents gravity, and $f(v)$ represents frictional force. The control system simulation unit 9 outputs the calculated displacement p as the estimated displacement to a motion equation calculation unit. In addition, a parameter identified by the model acceleration calculation unit 1 is used in calculation of the frictional force $f(v)$ of equation (9). The displacement p calculated by the rigid body model 14 is input as the estimated displacement to the feedback control unit 12.

Note that, in the present embodiment, while the output of the control system simulation unit 9 is the estimated displacement, the estimated acceleration and the estimated speed are computed in the control system simulation unit 9. Thus, the estimated acceleration in the control system simulation unit 9 may be used as an output of the model acceleration calculation unit 1. Alternatively, the control system simulation unit 9 in the model acceleration calculation unit 1 may output the computed estimated speed, perform time differentiation on the output estimated speed once, and then output the calculated value as the model acceleration.

The abnormality diagnosis apparatus according to the present embodiment can diagnose whether the power transmission mechanism 7 is abnormal with high accuracy by lowering the influence of a change in friction that is a change in the characteristics.

Fourth Embodiment

Figure 9:
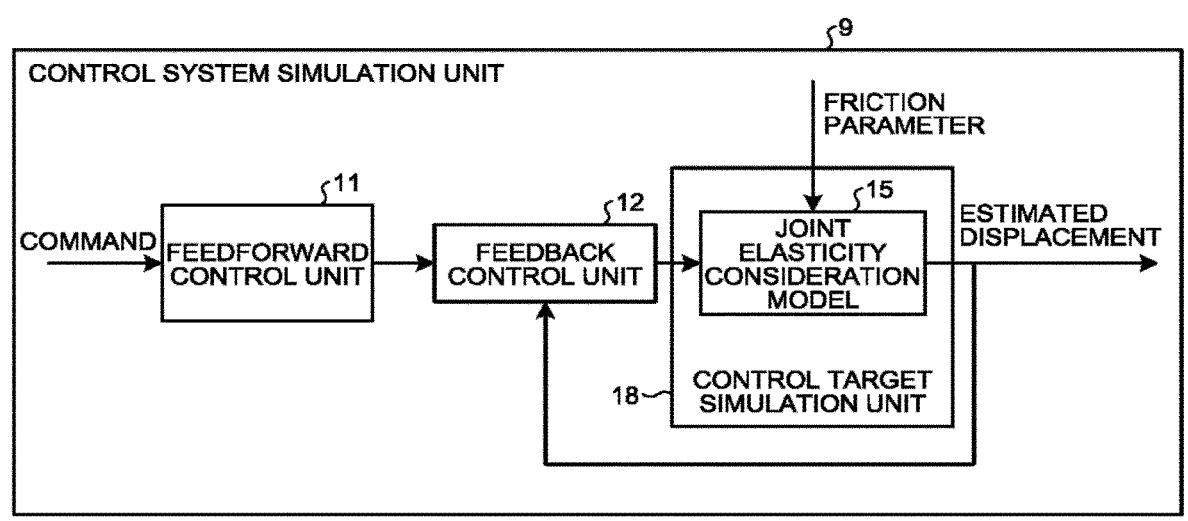
FIG. 9 is a block diagram illustrating the inside of a control system simulation unit according to a fourth embodiment.

A fourth embodiment differs from the third embodiment in the inside of the control system simulation unit 9. Thus, a description will be made only of the inside of the control system simulation unit 9. FIG. 9 is a block diagram illustrating the inside of the control system simulation unit 9 according to the fourth embodiment. While the rigid body model 14 is used as the model of the control target simulation unit 18 in the third embodiment, a joint elasticity consideration model 15 is used as illustrated in FIG. 9 in the fourth embodiment. A joint coupled by a link mechanism is provided between the motor 6 and the power transmission mechanism 7, and a model to be used takes into consideration the elasticity of the joint that has the characteristics of a linear spring, which has a constant spring constant. The joint elasticity consideration model 15 is a model that drives the load unit 8 side by using a value obtained by multiplying the difference between displacement on the load unit side and displacement on the motor side by the spring constant.

In the joint elasticity consideration model 15, am representing a vector of the motor acceleration, vm representing a vector of the motor speed, and pm representing a vector of the motor displacement of each shaft are used for the model for driving the load unit 8 side. In the joint elasticity consideration model 15, al representing a vector of the acceleration, vl representing a vector of the speed, and pl representing a vector of the displacement on the load unit 8 side that is an output shaft of the power transmission mechanism 7, τm representing a vector of the motor torque, and τl representing a vector of the output torque of the power transmission mechanism 7 are used for the model for driving the load unit 8 side. In addition, in the joint elasticity consideration model 15, Im representing a diagonal matrix constituted by motor inertia moments, f representing a vector constituted by the friction torque, M representing the inertia matrix, h representing a vector constituted by the centrifugal force and the Coriolis force, g representing a vector constituted by the gravity, and Kb representing a diagonal matrix constituted by the spring constant of the joint of each shaft are substituted into the following equations (10) to (12), which enables calculation of the motor acceleration am, the output torque τl of the power transmission mechanism 7, and the acceleration al on the load unit 8 side.

$$am = Im^{-1}(\tau m - \tau l - f(vm)) \tag{10}$$

$$\tau l = Kb(pl - pm) \tag{11}$$

$$al = M(pl)^{-1}(\tau l - h(pl, vl) - g(pl)) \tag{12}$$

The motor speed vm is calculated by time integration of the elements of the motor acceleration am. The motor displacement pm is calculated by time integration of the elements of the motor speed vm. The speed vl on the load unit 8 side is calculated by time integration of the elements of the acceleration al on the load unit 8 side. The displacement pl on the load unit 8 side is calculated by time integration of the elements of the speed vl on the load unit 8 side. In machinery having n drive shafts, the motor acceleration am, the motor speed vm, the acceleration al, and the speed vl can be expressed as a vector with n rows and one column. Specifically, a component in the first row and the first column of the elements is a first element. A component in the second row and the first column is a second element. A component in the third row and the first column is a third element. Thus, a component in the n-th row and the first column is an n-th element. Note that $Im^{-1}$ and $M(pl)^{-1}$ represent inverse matrices of Im and $M(pl)$, respectively. While the output of the control system simulation unit 9 is the estimated motor displacement in the present embodiment, the estimated motor acceleration in the control system simulation unit 9 may be used as an output of the model acceleration calculation unit 1 because the estimated motor acceleration and the estimated motor speed are also computed in the control system simulation unit 9. Alternatively, the control system simulation unit 9 in the model acceleration calculation unit 1 may output the estimated motor speed, perform time differentiation on the output estimated motor speed once, and then output the calculated value as the model acceleration.

The abnormality diagnosis apparatus according to the present embodiment can diagnose whether the power transmission mechanism 7 is abnormal with high accuracy by lowering the influence of a change in friction that is a change in the characteristics.

Fifth Embodiment

A fifth embodiment differs from the first embodiment in the inside of the model correction unit 2 and the inside of the model acceleration calculation unit 1. Thus, a description will be made only of the inside of the model correction unit 2 and the inside of the model acceleration calculation unit 1. In the model correction unit 2, sequential identification of the friction parameter is performed by the same unit as in the first embodiment. Furthermore, the control system simulation unit 9 in the model acceleration calculation unit 1 includes the feedforward control unit 11, the feedback control unit 12, the control target simulation unit 18, and a two-stage differencing unit. The model correction unit 2 calculates model acceleration by using a friction parameter value on which sequential identification is performed. In addition, the model correction unit 2 also calculates motor acceleration from the motor displacement measured by an encoder. The model correction unit 2 identifies a parameter of a correction function such that ea, which represents the result of subtraction of model acceleration a from the motor acceleration am, becomes as small as possible.

In the fifth embodiment, it is assumed that two values, i.e., a speed command value vd obtained by differentiating a position command and an acceleration command value ad obtained by further differentiating a position command, are input to the correction function and the correction function can be expressed by a polynomial including the acceleration command value and the speed command value that are position parameter values. Specifically, the correction function can be expressed as a weighted sum of the acceleration command value raised to the power of 1 and the acceleration command value raised to the power of 2, and the speed command value raised to the power of 1 and the speed command value raised to the power of 2 by equation (13) below. The model correction unit 2 also identifies the weight coefficients ka1i, ka2i, ka3i, and ka4i in the procedures below. Specifically, eai is calculated by the following equation (13). The suffix i indicates a value on an i-th shaft.

$$eai = ka1i*adi + ka2i*adi^2 + ka3i*vdi + ka4i*vdi^2 \quad (13)$$

In this case, yai, Rai, and rai are calculated by equations (14) to (16), respectively, and kpai[k] is calculated by equation (17). Note that k indicates a value in the k-th period of the identification period.

$$yai[k] = [adi[k], adi[k]^2, vdi[k], vdi[k]^2] \quad (14)$$

$$Rai[k] = Rai[k-1] + st*(-si*Rai[k-1] + yai[k]^T yai[k]) \quad (15)$$

$$rai[k] = rai[k-1] + st*(-si*rai[k-1] + (ami[k] - ai[k])*yai[k]^T) \quad (16)$$

$$kpai[k] = kpai[k-1] - st*Gi(Rai[k]kpai[k]kpai[k-1] - rai[k]) \quad (17)$$

The model correction unit 2 sends the calculated identified values to the model acceleration calculation unit 1. The identified values sent to the model acceleration calculation unit 1 are the first element of kpai[k] that is an identified value ka1i[k] of ka1i in the k-th identification period, the second element of kpai[k] that is an identified value ka2i[k] of ka2i in the k-th identification period, the third element of kpai[k] that is an identified value ka3i[k] of ka3i in the k-th identification period, and the fourth element of kpai[k] that is an identified value ka4i[k] of ka4i in the k-th identification period. Specifically, kpai calculated by equation (17) is obtained as a vector with four rows and one column. An element in the first row and the first column of kpai is the first element. An element in the second row and the first column of kpai is the second element. An element in the third row and the first column of kpai is the third element. An element in the fourth row and the first column of kpai is the fourth element. The model correction unit 2 also sends the values of kpai[k] to the model acceleration calculation unit 1.

Figure 10:
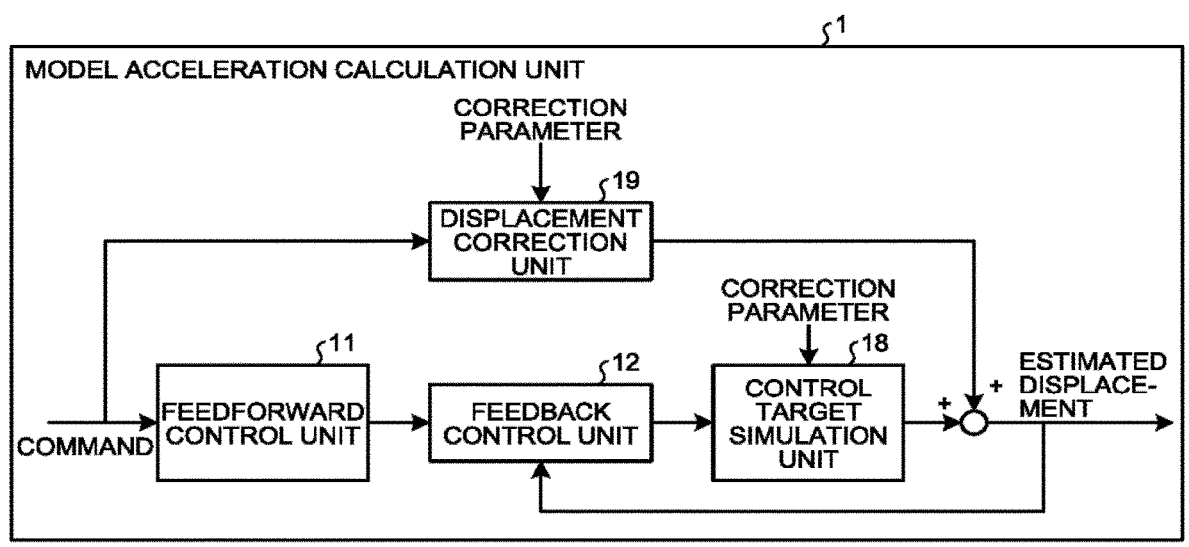
FIG. 10 is a block diagram illustrating the inside of a model acceleration calculation unit according to a fifth embodiment.

FIG. 10 is a block diagram illustrating the inside of the model acceleration calculation unit 1 according to the fifth embodiment. Because the processing in the feedforward control unit 11 and the feedback control unit 12 according to the fifth embodiment is the same as that in the first embodiment, the description thereof will not be repeated, and a description will be made of the inside of a displacement correction unit 19. The displacement correction unit 19 receives a position command and performs time differentiation on the position command to calculate a speed command and an acceleration command. Subsequently, the control target simulation unit 18 calculates an acceleration correction value eai on the basis of equation (13) by using a correction parameter kpai[k] input from the model correction unit 2. The control target simulation unit 18 integrates the calculated eai twice, adds the integration result as a correction value of displacement to the estimated displacement, and outputs the addition result. Alternatively, in the present embodiment, instead of performing correction in the control system simulation unit 9, the control target simulation unit 18 may output the estimated displacement and the acceleration correction value eai, and output, as the model acceleration, the result of adding the acceleration correction value eai to the estimated acceleration calculated by performing time differentiation on the estimated displacement twice.

The abnormality diagnosis apparatus according to the present embodiment can diagnose whether the power transmission mechanism 7 is abnormal with high accuracy by lowering the influence of a change in friction that is a change in the characteristics.

Sixth Embodiment

A sixth embodiment differs from the fifth embodiment in the inside of the model correction unit 2 and the abnormality determination unit 4, and a description will thus be made only of the model correction unit 2 and the abnormality determination unit 4. In the sixth embodiment, in a similar manner to the second embodiment, a section of a period during which abnormality determination is to be performed or a period indicating the time period during which abnormality determination is to be performed is set in advance, and the model correction unit 2 identifies a friction parameter by using the method of least squares from driving torque τmi, motor displacement pmi, motor speed vmi, and motor acceleration ami in the section or the period during which abnormality determination is performed. Subsequently, the model correction unit 2 identifies a parameter of an acceleration correction value by the method of least squares expressed by equation (13) from eai that is the result of subtraction of the model acceleration from the motor acceleration, the acceleration command adi, and the speed command vdi. The model correction unit 2 outputs the identified friction parameter and the identified parameter of the acceleration correction value as identical values in the section during which abnormality determination is performed to the model acceleration calculation unit 1. The abnormality determination unit 4 calculates the maximum value of absolute values of the result of subtraction of motor acceleration from the model acceleration in a section during which abnormality determination is performed. When the calculated maximum value of the absolute values is equal to or larger than a reference value, the abnormality determination unit 4 diagnoses the power transmission mechanism 7 as abnormal.

The abnormality diagnosis apparatus according to the present embodiment can diagnose whether the power transmission mechanism 7 is abnormal with high accuracy by lowering the influence of a change in friction that is a change in the characteristics.

Seventh Embodiment

A seventh embodiment differs from the fifth embodiment in the model correction unit 2 and the model acceleration calculation unit 1, and a description will thus be made only of the model correction unit 2 and the model acceleration calculation unit 1. While the acceleration command and the speed command are inputs for the acceleration correction value ea in the fifth embodiment, time differential of an output of the feedforward control unit 11 and further time differential thereof are inputs vd and ad, respectively, in the seventh embodiment. The model correction unit 2 performs sequential identification on the output of the feedforward control unit 11 by using equations (14) to (17) similarly to the fifth embodiment.

Figure 11:
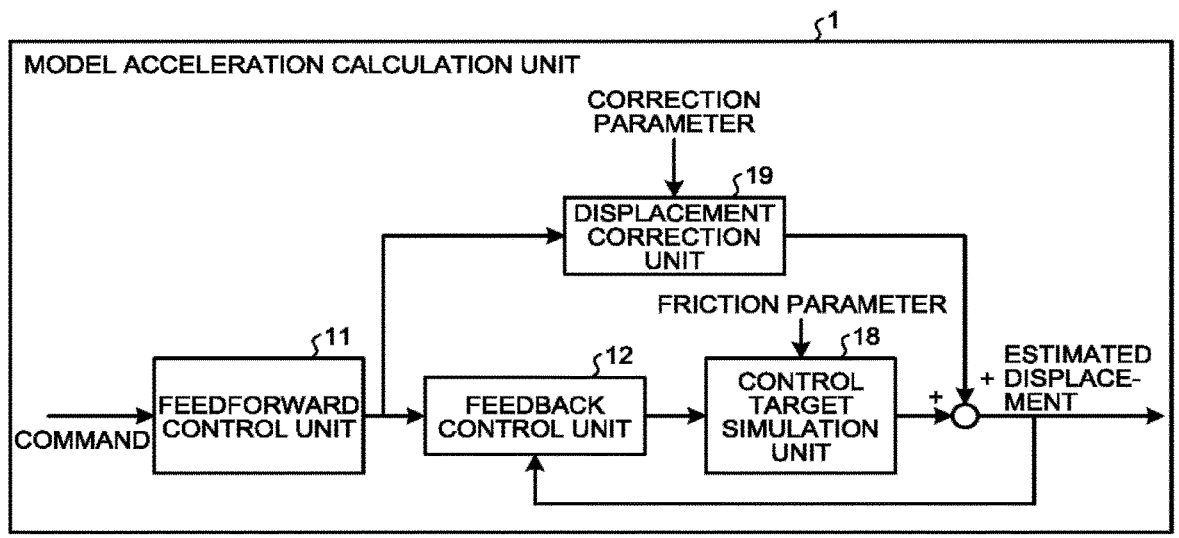
FIG. 11 is a block diagram illustrating the inside of a model acceleration calculation unit according to a seventh embodiment.

FIG. 11 is a block diagram illustrating the inside of the model acceleration calculation unit 1 according to the seventh embodiment. The displacement correction unit 19 receives the output of the feedforward control unit 11, performs time differentiation on an estimated displacement that is an output of the control system simulation unit 9 twice, and calculates an acceleration correction value ea on the basis of equation (13) by using the correction parameter kpai[k] input from the model correction unit 2. The control target simulation unit 18 integrates the calculated ea twice, adds the integration result as a correction value of displacement to the estimated displacement, and outputs the addition result. Alternatively, in the present embodiment, instead of performing correction in the control system simulation unit 9, the control target simulation unit 18 may output the estimated displacement and the acceleration correction value ea, and output, as the model acceleration, the result of adding the acceleration correction value ea to the estimated acceleration calculated by performing time differentiation on the estimated displacement twice.

The abnormality diagnosis apparatus according to the present embodiment can diagnose whether the power transmission mechanism 7 is abnormal with high accuracy by lowering the influence of a change in friction that is a change in the characteristics.

Eighth Embodiment

An eighth embodiment differs from the fifth embodiment in the model correction unit 2 and the model acceleration calculation unit 1, and a description will thus be made only of the model correction unit 2 and the model acceleration calculation unit 1. While the acceleration command and the speed command are inputs for the acceleration correction value ea in the fifth embodiment, time differential of an estimated motor displacement that is an output of the control target simulation unit 18 and further time differential thereof are inputs vd and ad, respectively, in the eighth embodiment. The model correction unit 2 performs sequential identification on the output of the control target simulation unit 18 by using equations (14) to (17) similarly to the fifth embodiment.

Figure 12:
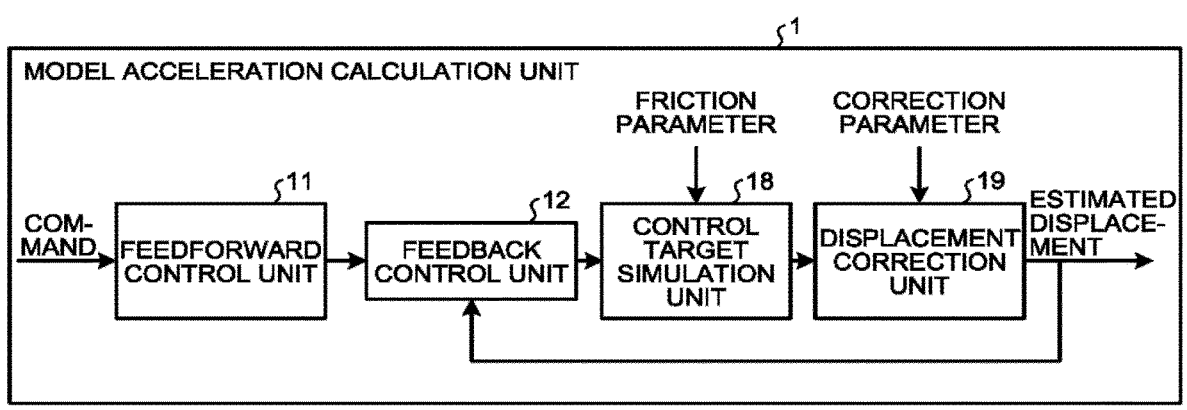
FIG. 12 is a block diagram illustrating the inside of a model acceleration calculation unit according to an eighth embodiment.

FIG. 12 is a block diagram illustrating the inside of the model acceleration calculation unit 1 according to the eighth embodiment. The displacement correction unit 19 receives the output of the control target simulation unit 18, performs time differentiation twice, and calculates an acceleration correction value ea on the basis of equation (13) by using the correction parameter kpai[k] input from the model correction unit 2. The control target simulation unit 18 integrates the calculated ea twice, adds the integration result as a correction value of displacement to the estimated displacement, and outputs the addition result. Alternatively, in the present embodiment, instead of performing correction in the control system simulation unit 9, the control target simulation unit 18 may output the estimated displacement and the acceleration correction value ea, and output, as the model acceleration, the result of adding the acceleration correction value ea to the estimated acceleration calculated by performing time differentiation on the estimated displacement twice.

The abnormality diagnosis apparatus according to the present embodiment can diagnose whether the power transmission mechanism 7 is abnormal with high accuracy by lowering the influence of a change in friction that is a change in the characteristics.

Ninth Embodiment

Figure 13:
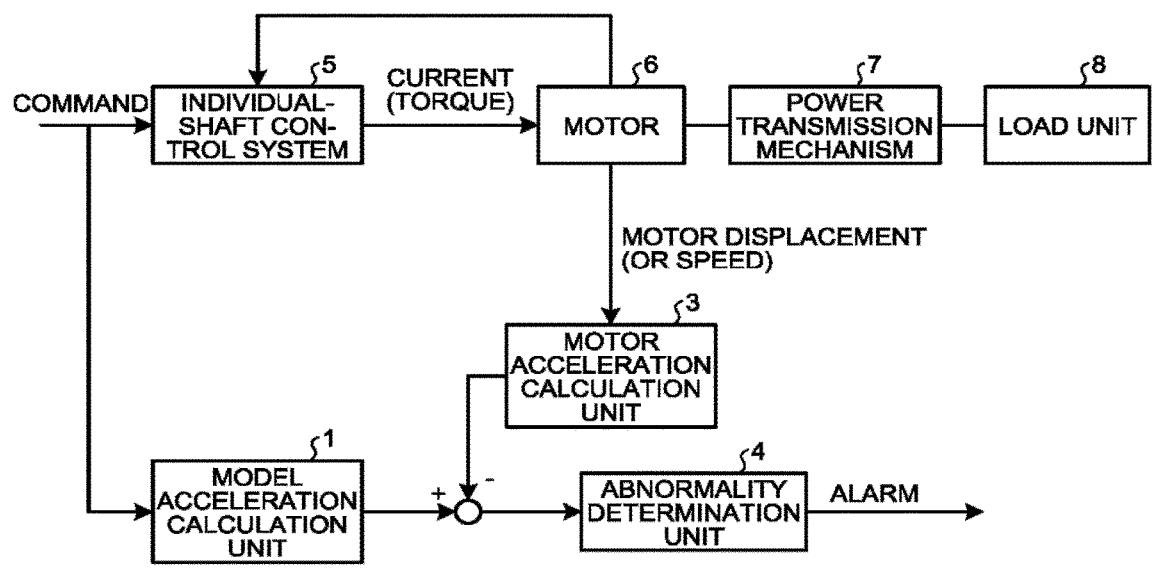
FIG. 13 is a block diagram of an abnormality diagnosis apparatus according to a ninth embodiment.
Figure 14:
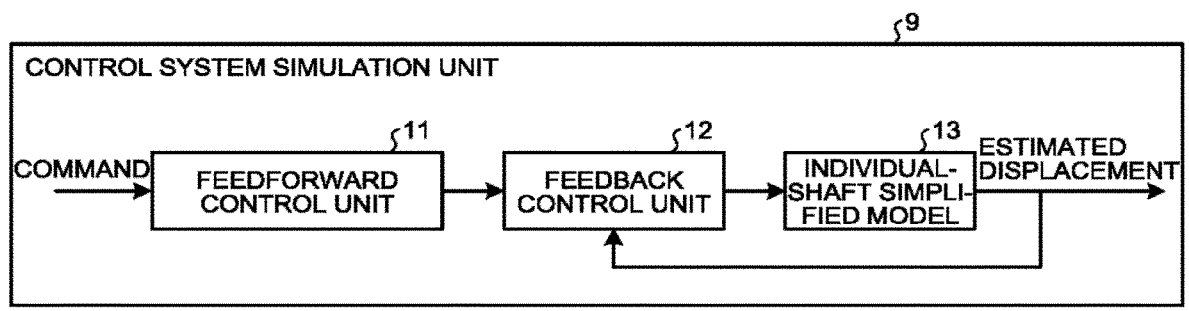
FIG. 14 is a block diagram illustrating the inside of a control system simulation unit according to the ninth embodiment.

FIG. 13 is a block diagram of an abnormality diagnosis apparatus according to a ninth embodiment. The ninth embodiment differs from the first embodiment in that the model correction unit 2 is not included. In the ninth embodiment, the control target simulation unit 18 in the model acceleration calculation unit 1 uses a predetermined fixed value as a friction parameter. FIG. 14 is a block diagram illustrating the inside of the control system simulation unit 9 according to the present embodiment. As illustrated in FIG. 14, the control system simulation unit 9 uses the individual-shaft simplified model 13 as the control target simulation unit 18.

Figure 15:
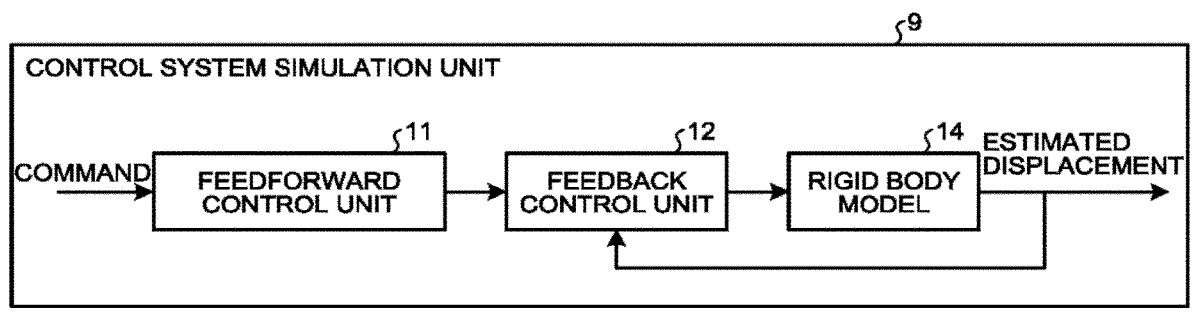
FIG. 15 is a block diagram illustrating the inside of a control system simulation unit according to the ninth embodiment.
Figure 16:
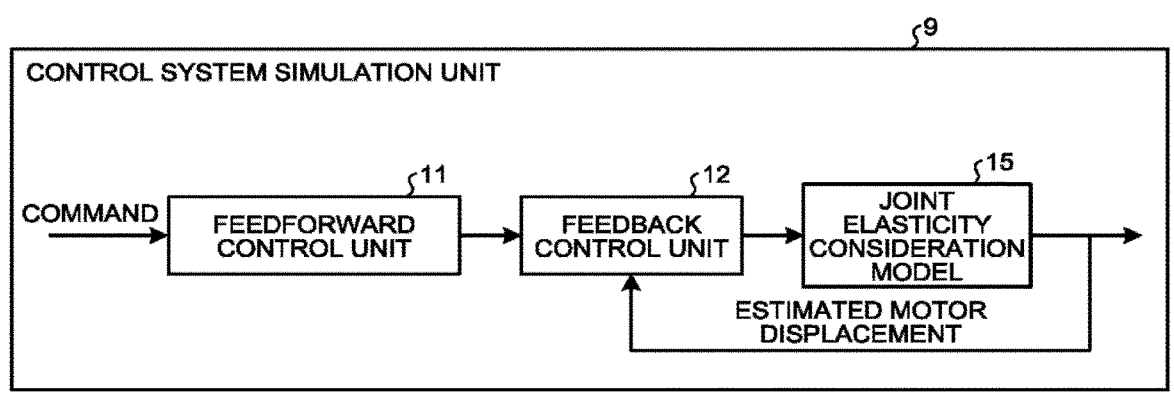
FIG. 16 is a block diagram illustrating the inside of a control system simulation unit according to the ninth embodiment.
Figure 17:
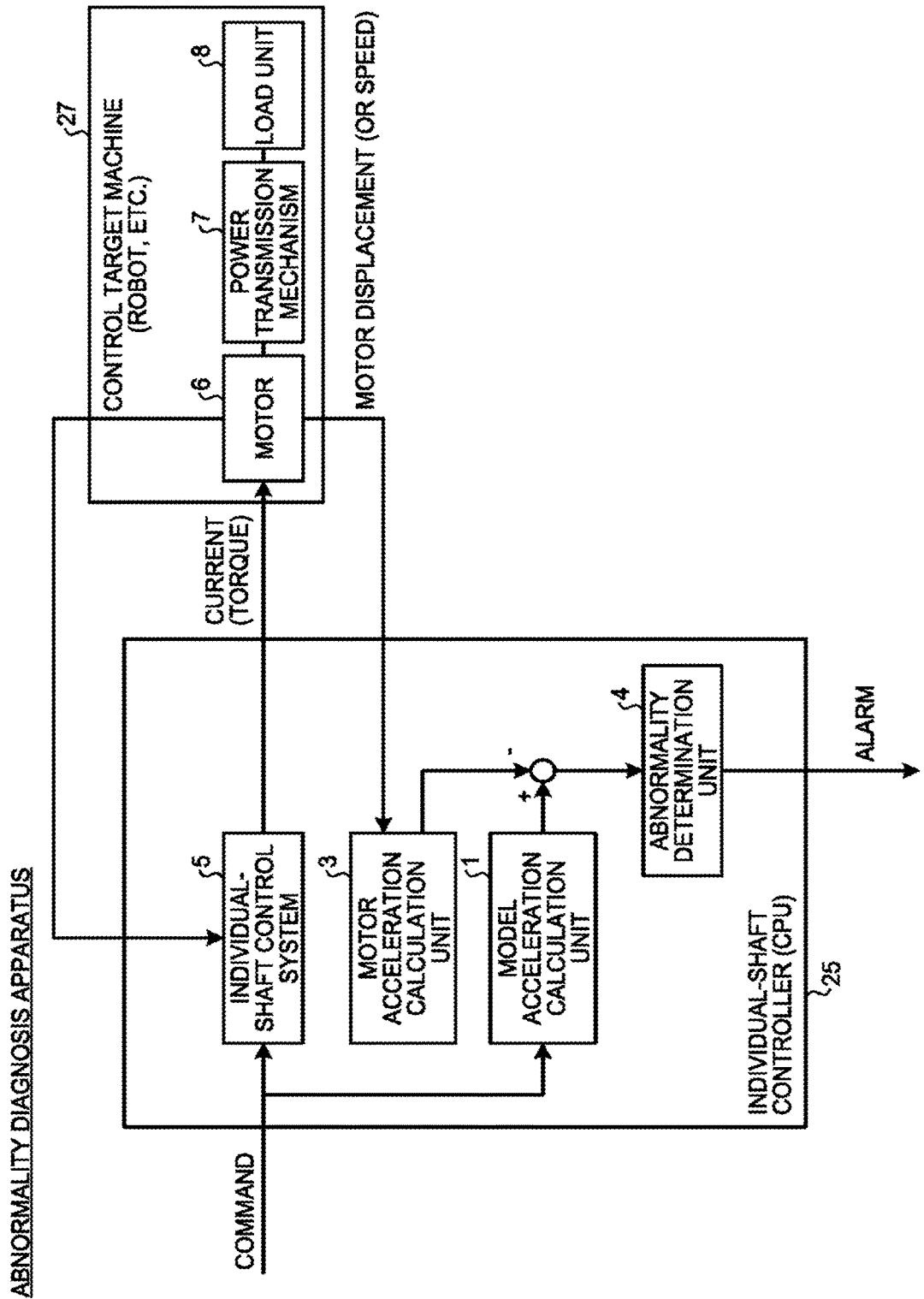
FIG. 17 is a diagram illustrating example implementation of the abnormality diagnosis apparatus according to the ninth embodiment.

In addition, FIG. 15 illustrates a block diagram of the inside of the control system simulation unit 9 in a case where the rigid body model 14 is used as the control target simulation unit 18, and FIG. 16 illustrates a block diagram of the inside of the control system simulation unit 9 in a case where the joint elasticity consideration model 15 is used as the control target simulation unit 18. The control system simulation unit 9 may be used as the feedforward control unit 11. FIG. 17 illustrates example implementation of the abnormality diagnosis apparatus of the ninth embodiment. In the abnormality diagnosis apparatus according to the present embodiment, the model acceleration calculation unit 1, the motor acceleration calculation unit 3, the abnormality determination unit 4, and the individual-shaft control system 5 are all implemented by a CPU of the individual-shaft controller 25 that controls the motor 6 of the control target.

The abnormality diagnosis apparatus according to the present embodiment can diagnose whether the power transmission mechanism 7 is abnormal with high accuracy by lowering the influence of a change in friction that is a change in the characteristics.

Tenth Embodiment

Figure 18:
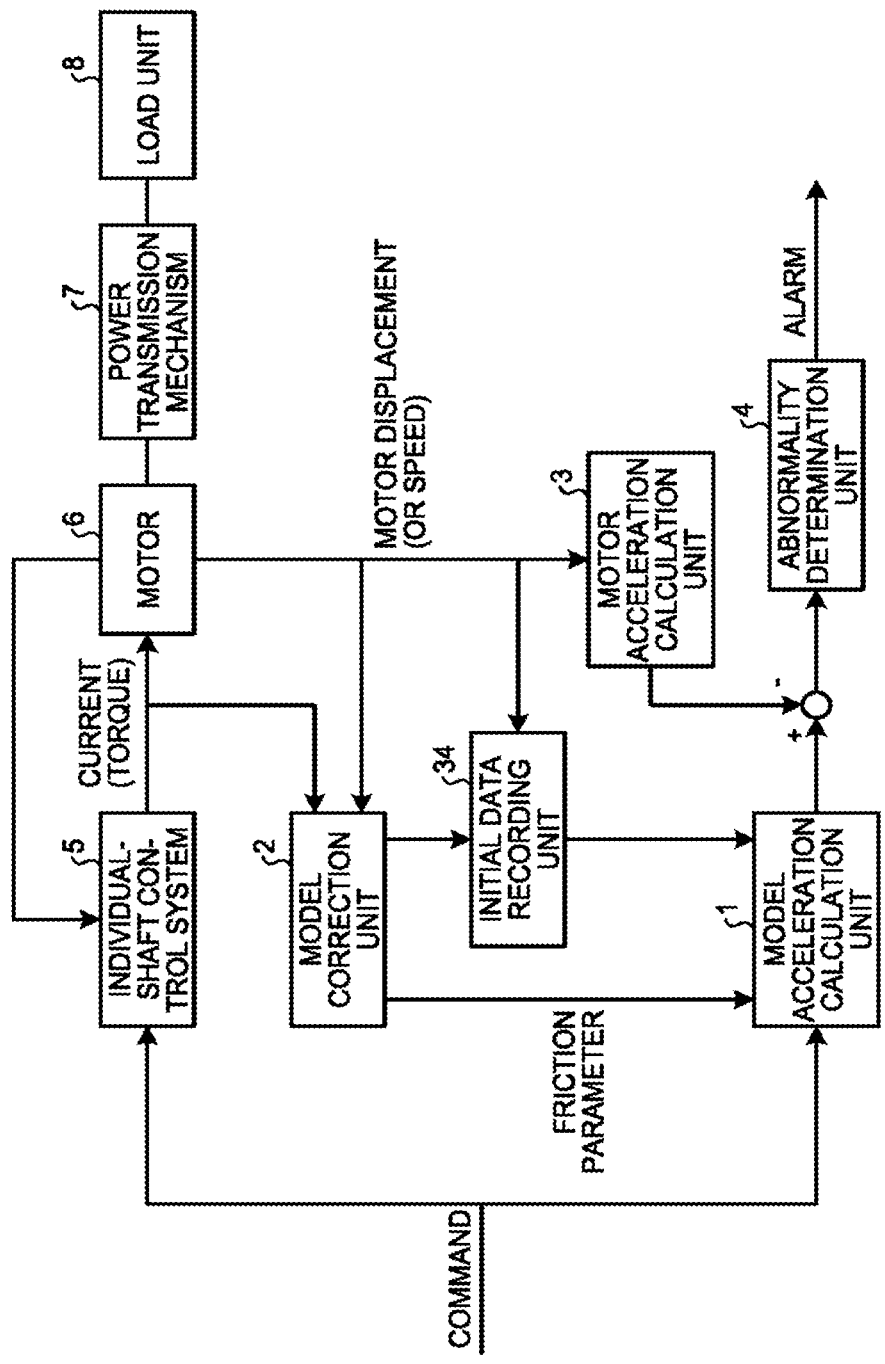
FIG. 18 is a block diagram of an abnormality diagnosis apparatus according to a tenth embodiment.

FIG. 18 illustrates a block diagram of an abnormality diagnosis apparatus according to a tenth embodiment. In the tenth embodiment, determination of whether an abnormality occurs is made on the basis of data of repeated same operation. The abnormality diagnosis apparatus 101 according to the present embodiment includes a recording unit that records operation data that is operation information on machinery when operations are normal. The recording unit functions as an initial data recording unit 34. Examples of operation data when operations are normal include motor torque and motor displacement when operations are normal. The initial data recording unit 34 inputs recorded data to the model acceleration calculation unit 1. The model acceleration calculation unit 1 calculates a friction parameter from the operation data recorded as initial data, and also records the calculated friction parameter as an initial friction parameter in the initial data recording unit 34. The inside of the model correction unit 2 is similar to that in the second embodiment, and the friction parameters are identified in a batch from the operation data when operations are normal recorded in the initial data recording unit 34.

In abnormality diagnosis, when the same operation as an operation corresponding to the operation data recorded in the initial data recording unit 34 is to be performed, the model correction unit 2 calculates a current friction parameter and outputs the calculated current friction parameter to the model acceleration calculation unit 1. In the model acceleration calculation unit 1, time differentiation is performed on the motor displacement recorded in the initial data recording unit 34 to calculate the motor acceleration of the operation data recorded in the initial data recording unit 34 as time-series data data1.

Subsequently, in the model acceleration calculation unit 1, a position command and a friction parameter recorded in the initial data recording unit 34 are input to the control system simulation unit 9, and time differentiation is performed on the output of the control system simulation unit 9. With the same operation data recorded in the initial data recording unit 34, the model acceleration calculation unit 1 calculates time-series data data2 of model acceleration including the friction parameter calculated from the operation data at the time of initial data recording. In addition, in the model acceleration calculation unit 1, the position command and the current friction parameter output from the model correction unit 2 are input to the control system simulation unit 9, and time differentiation is performed on the output of the control system simulation unit 9 to calculate time-series data data3 of the model acceleration.

Figure 19:
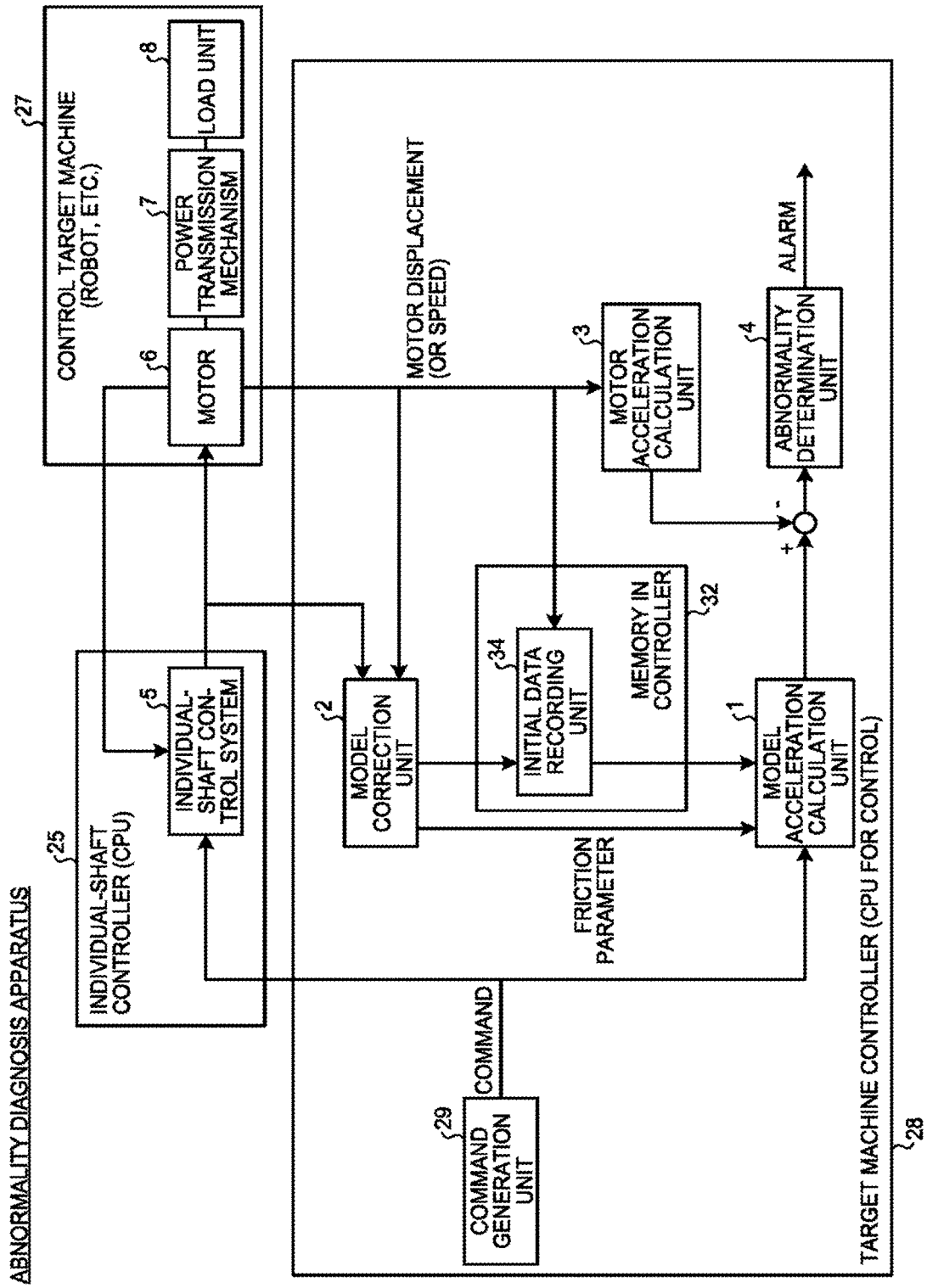
FIG. 19 is a diagram illustrating example implementation of the abnormality diagnosis apparatus according to the tenth embodiment.

The model acceleration calculation unit 1 outputs the motor acceleration at the time of initial data recording, with the data being corrected for the influence of a change in friction, i.e., data1−data2+data3, as time-series data. The model acceleration calculation unit 1 inputs the result of subtracting, from the calculated model acceleration, the motor acceleration at the same point in time, to the abnormality determination unit 4. The abnormality determination unit 4 calculates the maximum value of absolute values or the average value of absolute values of the input for the target operation, and determines that an abnormality occurs when the maximum value or the average value is equal to or larger than a reference value. Example implementation of the abnormality diagnosis apparatus 101 of the tenth embodiment is illustrated in FIG. 19. The model correction unit 2, the model acceleration calculation unit 1, the motor acceleration calculation unit 3, and the abnormality determination unit 4 are implemented by a CPU of a machine controller that controls a control target such as a robot. The initial data recording unit 34 is implemented by a memory 32 included in the machine controller.

The abnormality diagnosis apparatus according to the present embodiment can diagnose whether the power transmission mechanism 7 is abnormal with high accuracy by lowering the influence of a change in friction that is a change in the characteristics. In addition, the abnormality diagnosis apparatus according to the present embodiment can diagnose whether the power transmission mechanism 7 is abnormal with high accuracy because the influence of an unmodeled factor of a control target can be reduced.

Eleventh Embodiment

An abnormality diagnosis apparatus according to an eleventh embodiment has a configuration similar to that in the block diagram illustrated in FIG. 1. Because the difference between the present embodiment and the first embodiment is in the inside of the abnormality determination unit 4, a description will be made only of the inside of the abnormality determination unit 4. In the eleventh embodiment, the average value of the absolute values of input is used for abnormality determination. The average value may be calculated as an average value in a section specified separately or may be calculated as an average value in each predetermined period. The abnormality determination unit 4 determines that an abnormality occurs when the calculated average value is larger than a reference value.

The abnormality diagnosis apparatus according to the present embodiment can diagnose whether the power transmission mechanism 7 is abnormal with high accuracy by lowering the influence of a change in friction that is a change in the characteristics. In addition, the abnormality diagnosis apparatus according to the present embodiment can diagnose whether the power transmission mechanism 7 is abnormal with high accuracy because the influence of an unmodeled factor of a control target can be reduced.

Twelfth Embodiment

An abnormality diagnosis apparatus according to a twelfth embodiment has a configuration similar to that in the block diagram illustrated in FIG. 1. Because the difference between the present embodiment and the first embodiment is in the inside of the abnormality determination unit 4, a description will be made only of the inside of the abnormality determination unit 4. In the twelfth embodiment, the abnormality determination unit 4 includes a non-dimensional symptom parameter calculation unit that calculates a non-dimensional symptom parameter. The non-dimensional symptom parameter is used for determination of whether the power transmission mechanism 7 is abnormal. Examples of the non-dimensional symptom parameter include form factor, impact index, crest factor, skewness, and kurtosis. The abnormality determination unit 4 calculates at least one of these non-dimensional symptom parameters in a section specified separately or in each predetermined period. The abnormality determination unit 4 has a predetermined threshold and can diagnose whether the power transmission mechanism 7 is abnormal by comparing the calculated non-dimensional symptom parameter with the threshold.

The form factor, the impact index, the crest factor, the skewness, and the kurtosis are calculated by using statistics such as an average value, distribution, and a standard deviation of n time-series data used in the tenth embodiment, and are used as non-dimensional symptom parameters for abnormality determination. Note that the statistics are calculated and obtained by the model acceleration calculation unit 1. Specific methods for calculating the form factor, the impact index, the crest factor, the skewness, and the kurtosis by using the calculated statistics such as an average value, distribution, and a standard deviation will be described below. The form factor can be calculated by dividing the standard deviation calculated above by the average of the absolute values. The impact index can be calculated by dividing a peak value by the standard deviation calculated above. Note that the peak value is an average value of absolute values of 10 time-series data taken in descending order from among the n time-series data. The crest factor can be calculated by dividing the peak value used above by the average value of the absolute values. The skewness is a value representing the degree of distortion in positive and negative directions from the average value of the vibration waveform of vibration in the power transmission mechanism, and it can be calculated by equation (18) below, where the average value of the absolute values of the time-series data $X_i$ is represented by $X_a$ and the standard deviation is represented by $X_{rms}$. Note that N represents the number of time-series data. The kurtosis is a value representing how impulsive a waveform is and can be calculated by equation (19) below.

[Formula 1]

$$\text{Skewness} = \left\{ \sum_{i=1}^{N} (|X_i| - X_a)^3 \right\} / (N-1) / X_{rms}^3 \quad (18)$$

[Formula 2]

$$\text{Kurtosis} = \left\{ \sum_{i=1}^{N} (|X_i| - X_a)^4 \right\} / (N-1) / X_{rms}^4 \quad (19)$$

The abnormality diagnosis apparatus according to the present embodiment can diagnose whether the power transmission mechanism 7 is abnormal with high accuracy by lowering the influence of a change in friction that is a change in the characteristics. In addition, the abnormality diagnosis apparatus according to the present embodiment can diagnose whether the power transmission mechanism 7 is abnormal with high accuracy because the influence of an unmodeled factor of a control target can be reduced.

Thirteenth Embodiment

An abnormality diagnosis apparatus according to a thirteenth embodiment has a configuration similar to that in the block diagram illustrated in FIG. 1. Because the difference from the first embodiment is in the inside of the abnormality determination unit 4, a description will be made only of the inside of the abnormality determination unit 4. In the thirteenth embodiment, frequency analysis is used for abnormality determination. The abnormality determination unit 4 diagnoses whether an abnormality occurs from transition of the peak frequency in the frequency analysis result. Specifically, in a case where 16 Hz is set as a reference value, the abnormality determination unit 4 diagnoses the power transmission mechanism 7 as abnormal when the peak frequency that is 20 Hz in a normal condition immediately after the start of operation of the power transmission mechanism 7 has gradually lowered to a value equal to or lower than the reference value.

The abnormality diagnosis apparatus according to the present embodiment can diagnose whether the power transmission mechanism 7 is abnormal with high accuracy by lowering the influence of a change in friction that is a change in the characteristics. In addition, the abnormality diagnosis apparatus 101 according to the present embodiment can diagnose whether the power transmission mechanism 7 is abnormal with high accuracy because it can extract a change in rigidity of the power transmission mechanism 7 more distinctly.

Fourteenth Embodiment

An abnormality diagnosis apparatus according to a fourteenth embodiment has a configuration similar to that in the block diagram illustrated in FIG. 1. Because the difference from the first embodiment is in the inside of the abnormality determination unit 4, a description will be made only of the inside of the abnormality determination unit 4. In the fourteenth embodiment, an output of a bandpass filter is used for abnormality determination. The bandpass filter has a characteristic of passing only signal components of a preset frequency. Note that the abnormality determination unit 4 can diagnose the power transmission mechanism 7 as abnormal when a signal component having passed through the bandpass filter is detected. Specifically, in a case where the power transmission mechanism 7 is determined to be abnormal when the vibration frequency has become equal to or lower than 16 Hz due to deterioration of the power transmission mechanism 7, the abnormality determination unit 4 determines that the power transmission mechanism 7 is abnormal when the average value of absolute values of the result of the vibration frequency of the power transmission mechanism 7 having passed through the bandpass filter of 16 Hz has become equal to or higher than the reference value.

The abnormality diagnosis apparatus according to the present embodiment can diagnose whether the power transmission mechanism 7 is abnormal with high accuracy by lowering the influence of a change in friction that is a change in the characteristics. In addition, the abnormality diagnosis apparatus 101 according to the present embodiment can diagnose whether the power transmission mechanism 7 is abnormal with high accuracy because it can extract a change in rigidity of the power transmission mechanism 7 more distinctly.

Fifteenth Embodiment

Figure 20:
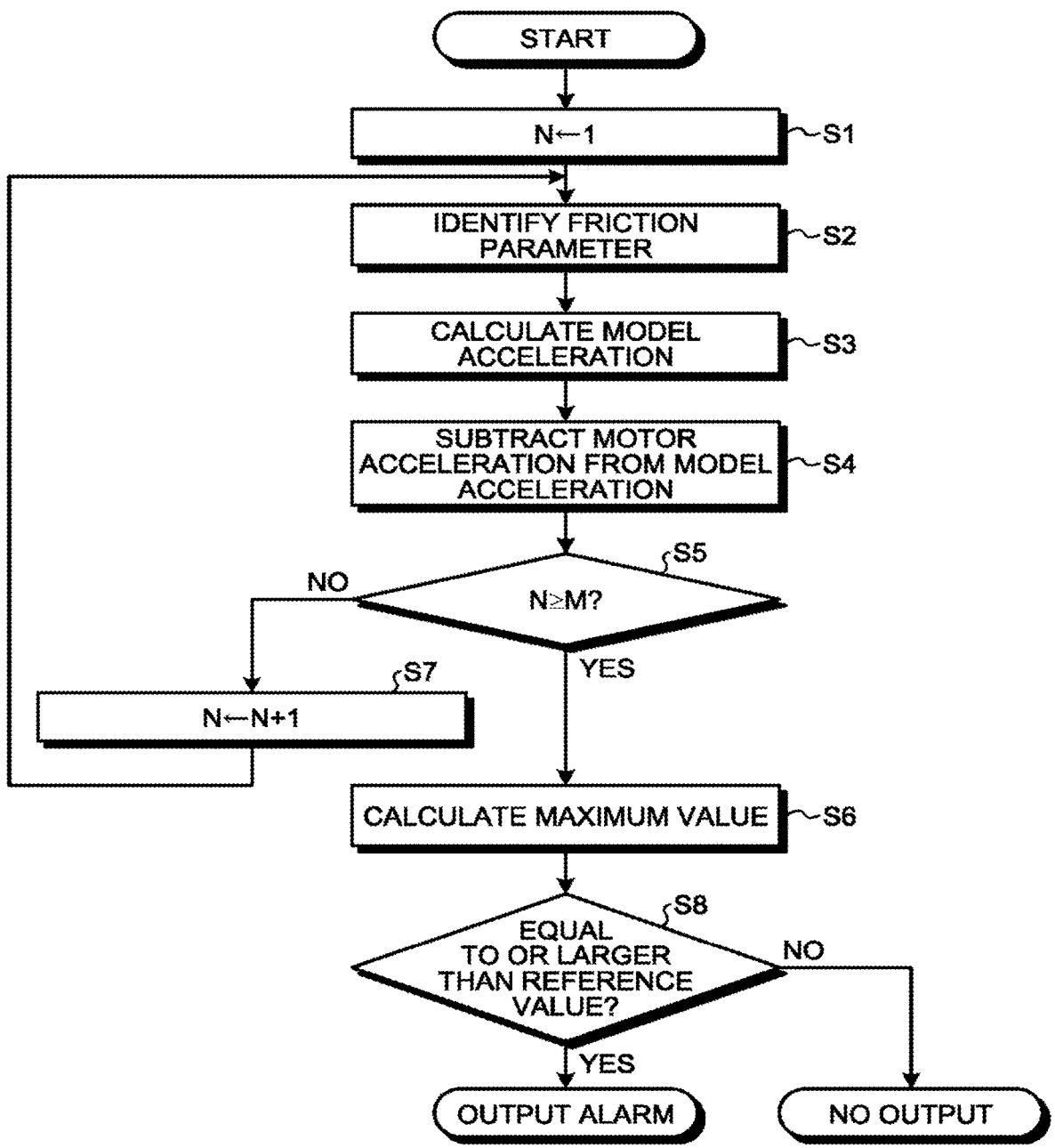
FIG. 20 is a flowchart of an abnormality diagnosis method according to a fifteenth embodiment.

FIG. 20 illustrates a flowchart of an abnormality diagnosis method of a fifteenth embodiment. The model acceleration calculation unit 1 initializes a count, i.e., resets N to 1, and identifies a friction parameter (steps S1 and S2). A unit for identifying the friction parameter is similar to the model correction unit 2 in the first embodiment. The model acceleration calculation unit 1 calculates model acceleration (step S3). The model acceleration is calculated by the same unit as the model acceleration calculation unit 1 in the first embodiment. The model acceleration calculation unit 1 subtracts motor acceleration from the model acceleration (step S4). In the abnormality diagnosis method according to the fifteenth embodiment, steps S2 to S4 are repeated unless a predetermined reference value has not been reached. The abnormality determination unit 4 determines whether the predetermined reference value has been reached and, if the predetermined reference value has been reached, calculates the maximum value of absolute values of the result of subtraction of the motor acceleration from the model acceleration (steps S5 and S6). The abnormality determination unit 4 determines whether the maximum value of the absolute values of the result of subtraction of the motor acceleration from the model acceleration is equal to or larger than the reference value, and outputs an alarm and determines that the power transmission mechanism 7 is abnormal if the maximum value is determined to be equal to or larger than the reference value (step S8).

The abnormality diagnosis apparatus according to the present embodiment can diagnose whether the power transmission mechanism 7 is abnormal with high accuracy by lowering the influence of a change in friction that is a change in the characteristics. In addition, the abnormality diagnosis apparatus according to the present embodiment can diagnose whether the power transmission mechanism 7 is abnormal with high accuracy even when the friction of the power transmission mechanism 7 changes depending on the conditions such as temperature.

Sixteenth Embodiment

Figure 21:
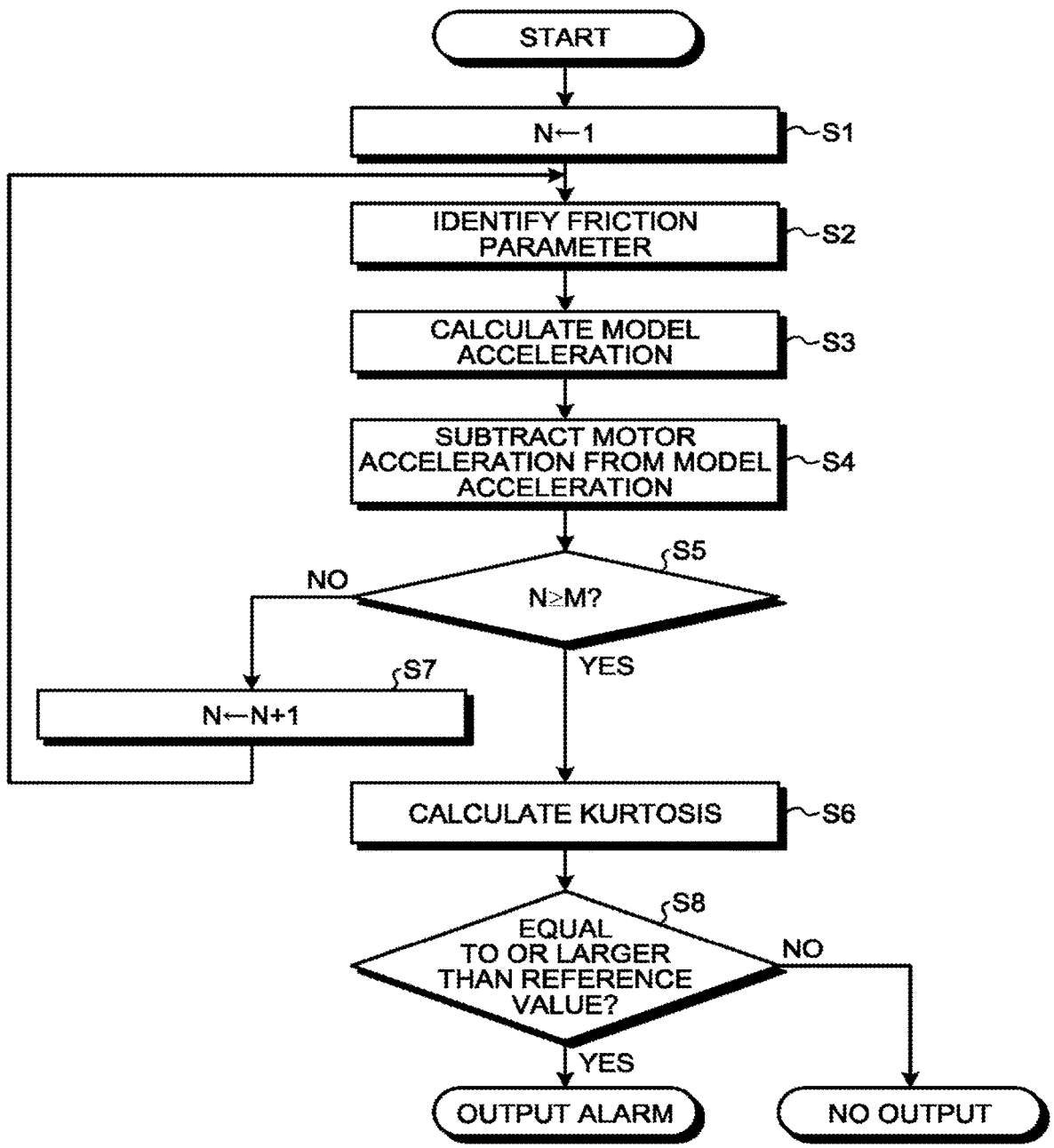
FIG. 21 is a flowchart of an abnormality diagnosis method according to a sixteenth embodiment.

FIG. 21 illustrates a flowchart of an abnormality diagnosis method of a sixteenth embodiment. The model acceleration calculation unit 1 initializes a count, i.e., resets N to 1, and identifies a friction parameter (steps S1 and S2). A unit for identifying the friction parameter is similar to the model correction unit 2 in the first embodiment. The model acceleration calculation unit 1 calculates model acceleration (step S3). The model acceleration is calculated by the same unit as the model acceleration calculation unit 1 in the first embodiment. The model acceleration calculation unit 1 subtracts motor acceleration from the model acceleration (step S4). In the abnormality diagnosis method, it is determined whether a predetermined reference value has been reached, and steps S2 to S4 are repeated unless the reference value has been reached. If the predetermined reference value has been reached, the abnormality determination unit 4 calculates the kurtosis of the subtraction result (steps S5 and S6). The abnormality determination unit 4 determines whether the calculated kurtosis is equal to or larger than a reference value (step S8). If the calculated kurtosis is determined to be equal to or larger than the reference value, the abnormality determination unit 4 outputs an alarm and determines that the power transmission mechanism 7 is abnormal.

The abnormality diagnosis method according to the present embodiment can diagnose whether the power transmission mechanism 7 is abnormal with high accuracy by lowering the influence of a change in friction that is a change in the characteristics. In addition, the abnormality diagnosis method according to the present embodiment can diagnose whether the power transmission mechanism 7 is abnormal with high accuracy even when the friction of the power transmission mechanism 7 changes depending on the conditions such as temperature.

Seventeenth Embodiment

Figure 22:
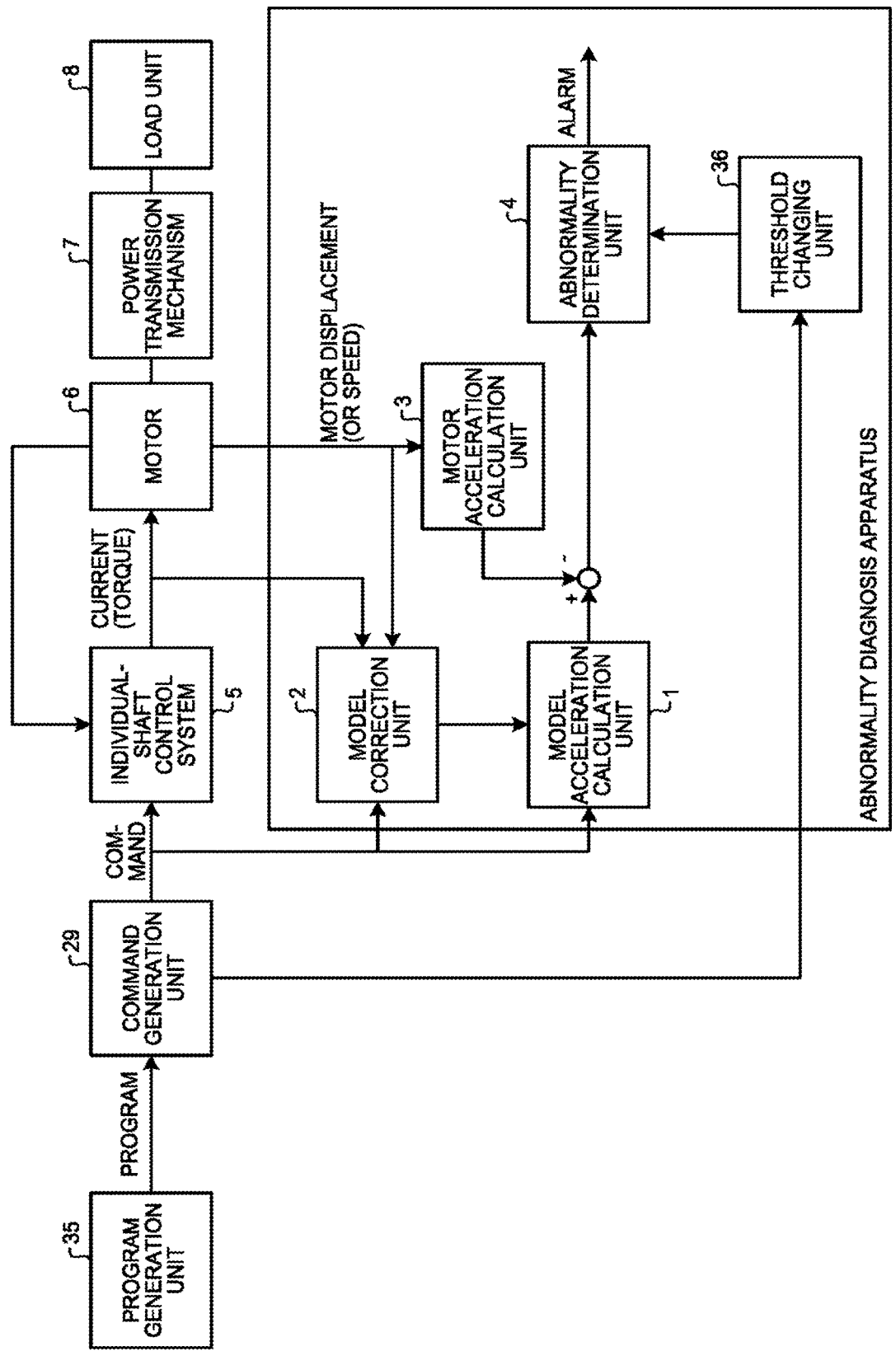
FIG. 22 is a diagram illustrating a configuration of an abnormality diagnosis apparatus of a seventeenth embodiment.

FIG. 22 is a diagram illustrating a configuration of an abnormality diagnosis apparatus of a seventeenth embodiment. Because components other than a program generation unit 35 and a threshold changing unit 36 are the same as those in the first embodiment, the description thereof will not be repeated. The program generation unit 35 generates programs for causing a control target, such as an industrial robot or a machine tool, to operate. The command generation unit 29 generates an instantaneous command to cause the control target to operate, i.e., a position command for each shaft, on the basis of operation instructions described in the programs generated by the program generation unit 35. The instantaneous command is input to the individual-shaft control system 5 and also input to the threshold changing unit 36. The threshold changing unit 36 determines a threshold on the basis of the input instantaneous command.

For example, the threshold changing unit 36 stores two kinds of thresholds therein, and calculates a speed command and an acceleration command for each shaft from a position command for the corresponding shaft. These thresholds are thresholds for abnormality determination. The threshold changing unit 36 selects a smaller value as a threshold to be output when the speed command and the acceleration command are equal to or smaller than respective specified values, or it selects and outputs a larger value when the condition that the speed command and the acceleration command are equal to or smaller than the respective specified values is not satisfied.

The change of the threshold may be switching between three or more values instead of switching between two values. The thresholds changed may be continuous values. In addition, the threshold may be switched depending on whether the position is near a particular position instead of based on the speed and the acceleration. The threshold changing unit 36 may change the threshold in the abnormality determination unit 4.

Eighteenth Embodiment

Figure 23:
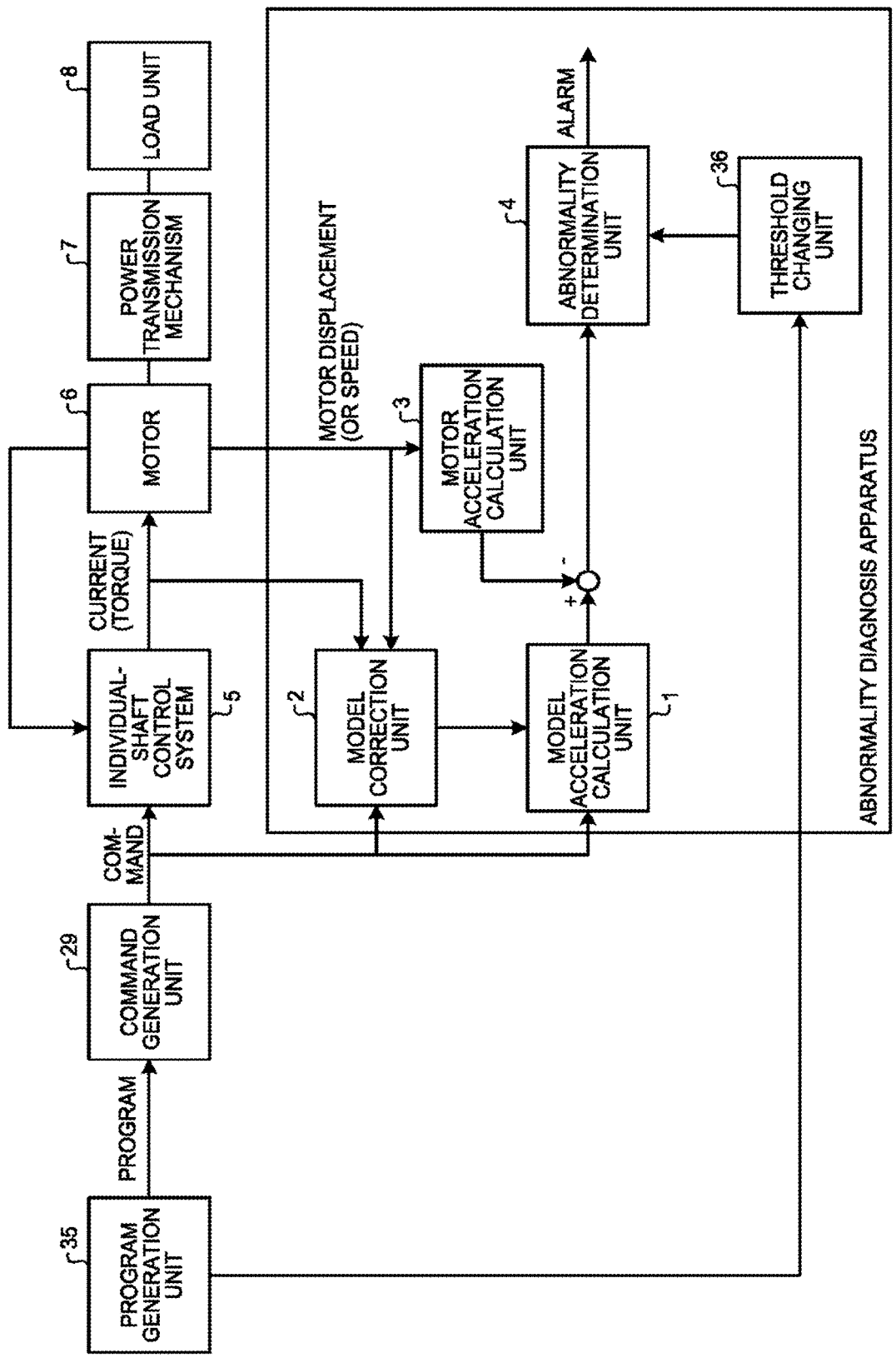
FIG. 23 is a diagram illustrating a configuration of an abnormality diagnosis apparatus of an eighteenth embodiment.

FIG. 23 is a diagram illustrating a configuration of an abnormality diagnosis apparatus of an eighteenth embodiment. Because components other than the program generation unit 35 and the threshold changing unit 36 are the same as those in the first embodiment, the description thereof will not be repeated. The program generation unit 35 generates programs for causing a control target, such as an industrial robot or a machine tool, to operate. In a program generated by the program generation unit 35, operation instructions to cause a control target, such as an industrial robot or a machine tool, to operate are described, and a threshold or setting of sensitivity in abnormality determination in the abnormality determination unit 4 used when operation is performed according to the operation instructions is described.

The command generation unit 29 generates an instantaneous command to cause the control target to operate, i.e., a position command for each shaft, on the basis of operation instructions described in the programs generated by the program generation unit 35. The instantaneous command is input to the individual-shaft control system 5. The threshold changing unit 36 changes the threshold to be used for abnormality determination by the abnormality determination unit 4 on the basis of the threshold or the sensitivity in abnormality determination described in the program generated by the program generation unit 35. In a case where the threshold is described in the program, the threshold is switched to that specified in the program. In a case where the sensitivity is specified in the program, the threshold held in the threshold changing unit 36 is changed depending on the specified sensitivity, and the changed threshold is output to the abnormality determination unit 4. The threshold changing unit 36 may change the threshold in the abnormality determination unit 4.

Nineteenth Embodiment

Figure 24:
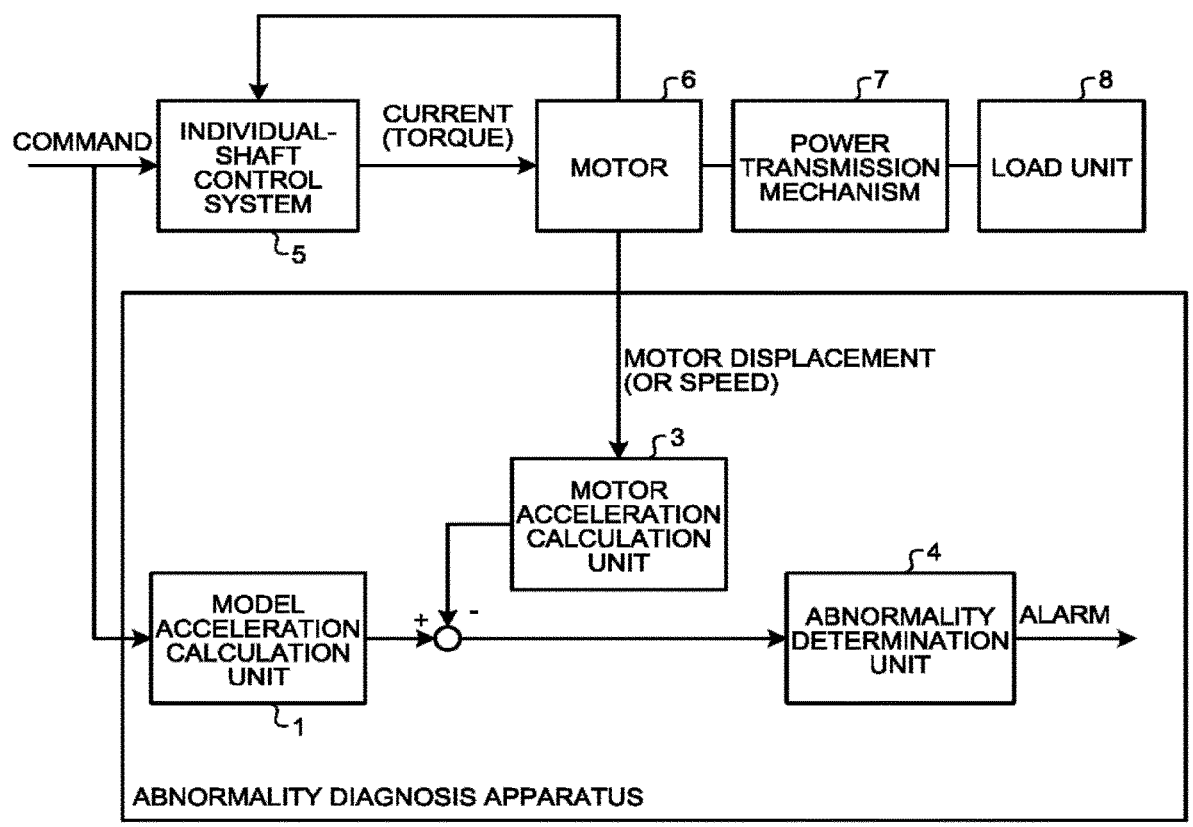
FIG. 24 is a diagram illustrating a configuration of an abnormality diagnosis apparatus of a nineteenth embodiment.
Figure 25:
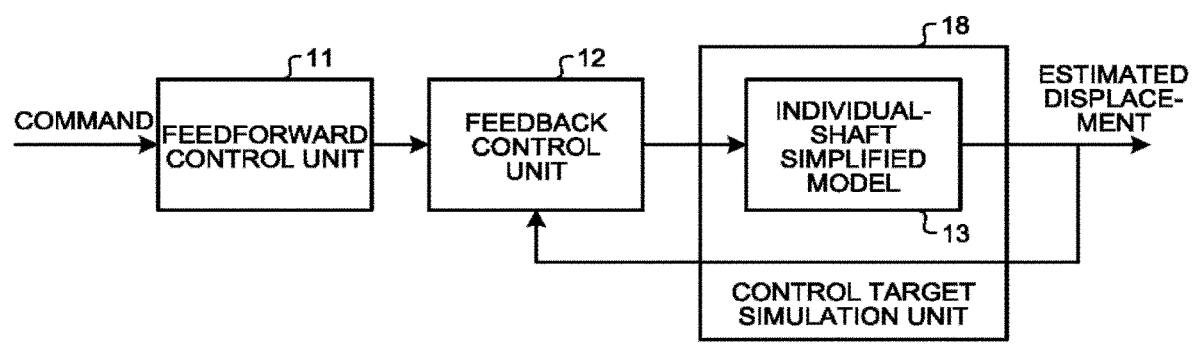
FIG. 25 is a diagram illustrating the inside of a control system simulation unit of the nineteenth embodiment.

FIG. 24 is a diagram illustrating a configuration of an abnormality diagnosis apparatus of a nineteenth embodiment. FIG. 25 is a diagram illustrating the inside of a control system simulation unit of the nineteenth embodiment. The abnormality diagnosis apparatus of the nineteenth embodiment does not include the model correction unit, unlike the first embodiment. The inside of the model acceleration calculation unit 1 is similar to that illustrated in FIG. 2. The control target simulation unit 18 in FIG. 25 includes the individual-shaft simplified model 13 in a similar manner to the first embodiment, but the parameter of friction used by the individual-shaft simplified model 13 is not an output of the model correction unit 2 but is calculated by using a friction parameter stored in advance in the individual-shaft simplified model 13. In the present embodiment, although the influence of a change in friction on the model acceleration is not considered, the motor acceleration is less likely to be affected by a change in friction than the motor torque because the motor of each shaft is subjected to feedback control, which produces an effect that abnormality diagnosis can be performed with high accuracy even when a change in friction occurs.

Twentieth Embodiment

Figure 26:
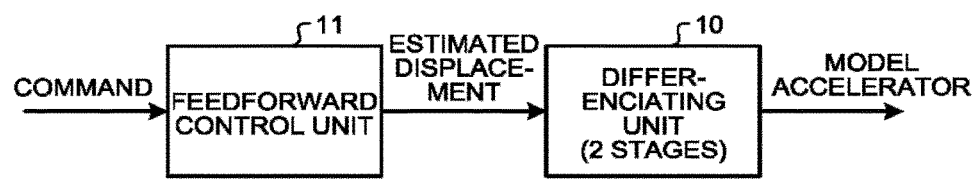
FIG. 26 is a diagram illustrating the inside of a control system simulation unit according to a twentieth embodiment.

FIG. 26 is a diagram illustrating the inside of a control system simulation unit of a twentieth embodiment. The configuration of the abnormality diagnosis apparatus of the twentieth embodiment is similar to that of the abnormality diagnosis apparatus illustrated in FIG. 24. The difference from the nineteenth embodiment is that the inside of the control system simulation unit 9 is as illustrated in FIG. 26. In the present embodiment, although the influence of a change in friction on the model acceleration is not considered, the motor acceleration is less likely to be affected by a change in friction than the motor torque because the motor of each shaft is subjected to feedback control, which produces an effect that abnormality diagnosis can be performed with high accuracy even when a change in friction occurs.

Effects produced by the abnormality diagnosis apparatuses and the abnormality diagnosis methods according to the embodiments described above will be described below. With the abnormality diagnosis apparatus or the abnormality diagnosis method according to the embodiments, abnormality diagnosis is performed on the basis of motor acceleration, on which the influence of a change in friction caused by a change in the temperature of a joint couple by a link mechanism between the motor 6 and the power transmission mechanism 7 is reduced as compared to motor current; therefore, abnormality diagnosis can be performed with high accuracy even in a case where the influence of a change in friction caused by a change in temperature is present. In addition, with the abnormality diagnosis apparatus or the abnormality diagnosis method according to the embodiments, a change in friction caused by a change in the temperature of the joint is identified and corrected; therefore, abnormality diagnosis can be performed with higher accuracy than in a case where the change in friction is not corrected even when the influence of the change in friction caused by a change in the temperature is present. With the abnormality diagnosis apparatus or the abnormality diagnosis method according to the embodiments, the influence of a change is friction is corrected before comparison with acceleration data in normal operation; therefore, abnormality diagnosis can be performed with high accuracy without detailed modeling of a control target.

Figure 27:
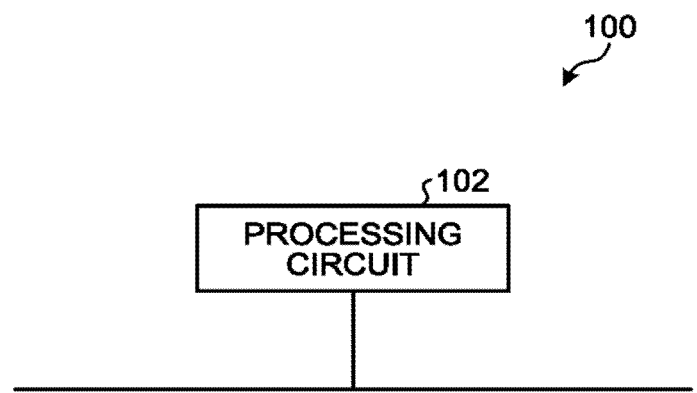
FIG. 27 is a hardware configuration diagram of the first to twentieth embodiments.

Each of the embodiments is achieved by implementing the target machine controller 28 by a CPU for control. Alternatively, each of the embodiments may be achieved by installing software that functions as the respective components of the abnormality diagnosis apparatus into a PC external to the target machine controller 28. A hardware configuration of the external PC that executes the software will now be described with reference to FIGS. 27 and 28. The external PC according to the embodiments can be implemented by hardware 100 illustrated in FIG. 27, i.e., a processing circuit 102. Specifically, the abnormality diagnosis apparatus includes a processing device for calculating the model acceleration, calculating the motor acceleration from the position information or the speed information on the motor 6, and diagnosing whether the power transmission mechanism 7 for a drive shaft is abnormal on the basis of the result of comparison between the calculated motor acceleration and the calculated model acceleration. The processing circuit 102 may be dedicated hardware or may be a central processing unit (CPU; also referred to as a central processor, a processing unit, a computing unit, a microprocessor, a microcomputer, a processor, or a digital signal processor (DSP)) that executes programs stored in a memory.

In a case where the processing circuit 102 is dedicated hardware, the processing circuit 102 is a single circuit, a composite circuit, a programmed processor, a parallel-programmed processor, an application specific integrated circuit (ASIC), a field programmable gate array (FPGA), or a combination thereof, for example. The model acceleration calculation unit 1, the motor acceleration calculation unit 3, and the abnormality determination unit 4 may be each implemented by the processing circuit 102, or the functions of the respective components may be collectively implemented by one processing circuit.

Figure 28:
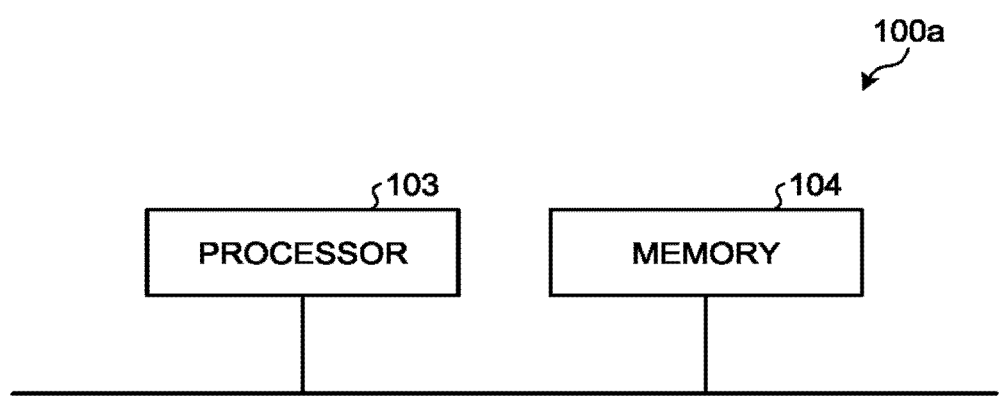
FIG. 28 is a hardware configuration diagram of the first to twentieth embodiments.

In a case where the processing circuit 102 is a CPU, the abnormality diagnosis apparatus can be implemented by hardware 100a illustrated in FIG. 28, i.e., a processor 103 and a memory 104 connected to the abnormality diagnosis apparatus. In this case, the model acceleration calculation unit 1, the motor acceleration calculation unit 3, and the abnormality determination unit 4 are implemented by software, firmware, or a combination of software and firmware. The software and firmware are described in the form of programs and stored in the memory 104. The processor 103 implements the functions of the respective components by reading and executing the programs stored in the memory 104. Specifically, the abnormality diagnosis apparatus includes a memory for storing programs that, when executed by the processing circuit 102, results in execution of a step of calculating the model acceleration, a step of calculating the motor acceleration from the position information or the speed information on the motor 6, and a step of diagnosing whether the power transmission mechanism 7 is abnormal. In other words, these programs cause a computer to execute the procedures and the methods of the model acceleration calculation unit 1, the motor acceleration calculation unit 3, and the abnormality determination unit 4. Note that the memory may be a nonvolatile or volatile semiconductor memory such as a random access memory (RAM), a read only memory (ROM), a flash memory, an erasable programmable read only memory (EPROM), or an electrically erasable programmable read only memory (EEPROM), a magnetic disk, a flexible disk, an optical disk, a compact disc, a mini disc, or a digital versatile disc (DVD), for example.

The configurations presented in the embodiments above are examples of the present invention, and can be combined with other known technologies or can be partly omitted or modified without departing from the scope of the present invention.

REFERENCE SIGNS LIST

1 model acceleration calculation unit; 2 model correction unit; 3 motor acceleration calculation unit; 4 abnormality determination unit; 5 individual-shaft control system; 6 motor; 7 power transmission mechanism; 8 load unit; 9 control system simulation unit; 10 differencing unit; 11 feedforward control unit; 12 feedback control unit; 13 individual-shaft simplified model; 14 rigid body model; 15 joint elasticity consideration model; 16 proportional control unit; 17 proportional integral control unit; 18 control target simulation unit; 19 displacement correction unit; 21 differential processing unit; 25 individual-shaft controller; 27 control target machine; 28 target machine controller; 29 command generation unit; 32 memory in controller; 34 initial data recording unit; 35 program generation unit; 36 threshold changing unit; 100, 100a hardware; 102 processing circuit; 103 processor; 104 memory.

The invention claimed is:

1. An abnormality diagnosis apparatus comprising:
    a model acceleration calculator to calculate model acceleration that is a predicted value of motor acceleration of a motor, the motor being connected to a load by a power transmission mechanism, and the motor, the power transmission mechanism, and the load collectively comprising a control target;
    a motor acceleration calculator to calculate the motor acceleration from one of position information and speed information on the motor;
    the model acceleration calculator including a control system simulator to calculate the model acceleration in accordance with a position command sent to an individual-shaft control system, the control system simulator including a control target simulator that is a model of the control target, including the motor, the power transmission mechanism, and the load, viewed from a shaft of the motor; and
    an abnormality determiner to diagnose whether the power transmission mechanism included in the control target is abnormal on a basis of a result of comparison between the motor acceleration and the model acceleration.

2. The abnormality diagnosis apparatus according to claim 1, further comprising:
    a model corrector to calculate a friction parameter detection value of the motor as a friction parameter identified value by performing an identification process, wherein
    the control target simulator modifies an estimated friction associated with an each shaft direction in which the motor is driven in accordance with the friction parameter identified value calculated by the model corrector.

3. The abnormality diagnosis apparatus according to claim 2, wherein
    the model acceleration calculator further comprises a displacement corrector to calculate a speed command value and an acceleration command value as a position parameter value in accordance with the position command, and
    the control target simulator modifies the position parameter value in accordance with the friction parameter identified value calculated by the model corrector.

4. The abnormality diagnosis apparatus according to claim 1, further comprising:
    a storage to store operation information on the motor when an operation is normal; and
    a model corrector to calculate the operation information as an initial friction parameter identified value by performing an identification process, and store the calculated initial friction parameter identified value in the storage, wherein
    the model acceleration calculator calculates model acceleration of the power transmission mechanism by performing a predicted value calculation process in accordance with the initial friction parameter identified value calculated by the model corrector and the operation information stored in the storage.

5. The abnormality diagnosis apparatus according to claim 1, wherein
    the abnormality determiner includes a high-pass filter to pass a signal component with a frequency higher than a preset frequency among signal components of the motor acceleration, and
    when a signal component that passes through the high-pass filter is detected, the abnormality determiner diagnoses whether the power transmission mechanism is abnormal in accordance with the detected signal component.

6. The abnormality diagnosis apparatus according to claim 1, wherein
    the abnormality determiner includes a frequency analyzer to perform frequency analysis on vibration in the power transmission mechanism, and
    the abnormality determiner diagnoses whether the power transmission mechanism is abnormal on a basis of transition of a peak frequency obtained by the frequency analyzer.

7. The abnormality diagnosis apparatus according to claim 1, wherein
    the abnormality determiner includes a non-dimensional symptom parameter calculator to calculate a non-dimensional symptom parameter by using a statistic obtained from the model acceleration calculator, and
    the abnormality determiner diagnose whether the power transmission mechanism is abnormal on a basis of a result of comparison between the non-dimensional symptom parameter and a predetermined threshold.

8. The abnormality diagnosis apparatus according to claim 1 comprising:
    a threshold changer to switch a threshold in the abnormality determiner to one of two or more threshold values, the threshold being used for determining whether the abnormality occurs, wherein
    the threshold to be output by the threshold changer is determined on a basis of a command to cause the control target to operate, the command being generated by a command generator.

9. The abnormality diagnosis apparatus according to claim 1 comprising:
    a threshold changer to switch a threshold in the abnormality determiner to one of two or more threshold values, the threshold being used for determining whether the abnormality occurs, wherein
    the threshold is specified by a program to cause the control target to operate, the program being generated by a program generator.

10. An abnormality diagnosis method comprising:
    calculating model acceleration that is a predicted value of motor acceleration of a motor, the motor being connected to a load by a power transmission mechanism, and the motor, the power transmission mechanism, and the load collectively comprising a control target;
    calculating the motor acceleration from one of position information and speed information on the motor, the model acceleration calculating including a control system simulating to calculate the model acceleration in accordance with a position command sent to an individual-shaft control system, the control system simulating including a control target simulating based on a model of the control target, including the motor, the power transmission mechanism, and the load, viewed from a shaft of the motor; and diagnosing whether a power transmission mechanism included in the control target is abnormal on a basis of a result of comparison between the motor acceleration and the model acceleration.

11. The abnormality diagnosis apparatus according to claim 1, further comprising:
- a program generator to generate a program for causing the control target to operate;
- a command generator to generate the position command for each shaft that is an instantaneous command to cause the control target to operate, on a basis of an operation instruction described in the program generated by the program generator; and
- a threshold changer to switch a threshold used for determining whether the abnormality occurs in the abnormality determiner to one of two or more threshold values, on a basis of the position command for each shaft.

12. The abnormality diagnosis apparatus according to claim 1, wherein
- the model acceleration calculator includes a differentiator at a stage subsequent to the control system simulator,
- the control system simulator outputs, to the differentiator, an estimated value of motor displacement that takes into account characteristics of feedforward control and feedback control in accordance with the position command sent to the individual-shaft control system, and
- the differentiator performs time differentiation twice on the estimated value of motor displacement to calculate the model acceleration.

13. The abnormality diagnosis apparatus according to claim 7, wherein
- the non-dimensional symptom parameter is at least one of form factor, impact index, crest factor, skewness, and kurtosis, and
- the abnormality determiner calculates the non-dimensional symptom parameters in a section specified separately or in each predetermined period.

\* \* \* \* \*